(12) United States Patent
Umemiya et al.

(10) Patent No.: US 6,841,489 B2
(45) Date of Patent: Jan. 11, 2005

(54) METHOD OF MANUFACTURING A SEMICONDUCTOR DEVICE AND METHOD OF FORMING A FILM

(75) Inventors: Shigeyoshi Umemiya, Kawasaki (JP); Kenji Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 10/364,379

(22) Filed: Feb. 12, 2003

(65) Prior Publication Data

US 2003/0171002 A1 Sep. 11, 2003

(30) Foreign Application Priority Data

Mar. 5, 2002 (JP) ........................................ 2002-059532

(51) Int. Cl.$^7$ .............................................. H01L 21/31
(52) U.S. Cl. ...................................... 438/758; 438/789
(58) Field of Search ................................ 438/758, 789, 438/151

(56) References Cited

U.S. PATENT DOCUMENTS

| | | | |
|---|---|---|---|
| 4,523,544 A | | 6/1985 | Harada et al. |
| 5,229,319 A | * | 7/1993 | Kawakyu et al. ........... 117/102 |
| 5,811,349 A | | 9/1998 | Watabe |
| 6,010,969 A | * | 1/2000 | Vaartstra ..................... 438/758 |
| 6,130,118 A | * | 10/2000 | Yamazaki ................... 438/151 |
| 6,136,725 A | * | 10/2000 | Loan et al. ................. 438/758 |
| 6,139,922 A | * | 10/2000 | Kaloyeros et al. .......... 438/758 |
| 6,335,281 B1 | * | 1/2002 | Segi et al. ................... 438/680 |
| 6,482,752 B1 | * | 11/2002 | Yamazaki et al. ........... 438/758 |
| 6,528,435 B1 | * | 3/2003 | Yoo ............................ 438/788 |
| 6,630,413 B2 | * | 10/2003 | Todd ........................... 438/795 |

FOREIGN PATENT DOCUMENTS

| | | |
|---|---|---|
| GB | 1500691 | 2/1978 |
| JP | 5-9738 | 1/1993 |
| JP | 5-144733 | 6/1993 |
| JP | 5-270997 | 10/1993 |
| JP | 11-345770 | 12/1999 |

* cited by examiner

*Primary Examiner*—John F. Niebling
*Assistant Examiner*—Olivia T. Luk
(74) *Attorney, Agent, or Firm*—Westerman, Hattori, Daniels & Adrian, LLP

(57) ABSTRACT

A semiconductor device manufacturing method includes the steps of (a) introducing a first substrate into a first CVD chamber; (b) raising the first substrate temperature to a predetermined value; (c) growing a film on the first substrate by supplying vapor phase material in a material line to the first chamber; (d) introducing a second substrate into a second CVD chamber; (e) raising the second substrate temperature to the predetermined value; and (f) growing a film on the second substrate by supplying the vapor phase material to the second chamber. Steps (c) and (f) supply the vapor phase material selectively to the first and second chambers, respectively. In step (f) after step (c), the chamber to which the vapor phase material is supplied is switched from the first chamber to the second chamber so that the pressure of the vapor phase material in the material line is kept substantially constant.

28 Claims, 17 Drawing Sheets

METHOD OF MANUFACTURING A SEMICONDUCTOR DEVICE AND METHOD OF FORMING A FILM

CROSS-REFERENCE TO RELATED APPLICATION

The present application is based on Japanese priority application No. 2002-059532 filed on Mar. 5, 2002, the entire contents of which are hereby incorporated by reference.

BACKGROUND OF THE INVENTION

1. Field of the Invention

The present invention generally relates to semiconductor devices, and more particularly to a method and apparatus for forming a semiconductor device using MOCVD (metalorganic chemical vapor deposition).

2. Description of the Related Art

CVD or MOCVD apparatuses are widely used in the process of manufacturing semiconductor devices as film-forming apparatuses. For instance, the CVD apparatuses are used to form a variety of oxide and polysilicon films, while the MOCVD apparatuses are used to form a compound semiconductor film by epitaxial growth.

Recently, a semiconductor device using a ferroelectric or high-K dielectric film, such as a ferroelectric memory device, has started to be used.

Conventionally, a ferroelectric or high-K dielectric film employed in a semiconductor device such as a ferroelectric memory device is temporarily formed in an amorphous phase and then is crystallized by heat treatment. According to such a method, however, film deposition and crystallization should be performed separately. Further, a variety of problems occur due to heat treatment at high temperatures in an oxygen atmosphere employed for the process of crystallizing the amorphous phase.

In recent years, therefore, a technology of depositing a ferroelectric or high-K dielectric film directly in the form of a crystallized film by CVD has been studied. Particularly, in the case of forming a ferroelectric or high-K dielectric film, a variety of organometallic compounds including the component metal elements of the ferroelectric or high-K dielectric film should be used as material. That is, in the case of forming a ferroelectric or high-K dielectric film by CVD, MOCVD is employed.

FIG. 1 is a diagram showing the configuration of a conventional CVD film-forming apparatus 11 used for forming a ferroelectric or high-K dielectric film by CVD.

According to FIG. 1, the CVD film-forming apparatus 11 includes a CVD film-forming chamber 12 and first and second material gas supply lines 14A and 14B. The CVD film-forming chamber 12, which is evacuated by an exhaust system 13, includes a stage 12A holding a substrate to be processed (hereinafter a processing substrate). The first material gas line 14A supplies the CVD film-forming chamber 12 with oxygen gas as part of material gas. The second material gas line 14B supplies the CVD film-forming chamber 12 with organometallic compounds as material gas. The material gas line 14B includes a valve V1 that is opened and closed to control the supply of the organometallic compounds in the material gas line 14B to the CVD film-forming chamber 12 and a valve V2 bypassing the organometallic compounds to the exhaust system 13. Further, a substrate conveying chamber 15 which the processing substrate is conveyed to or from is connected to the CVD film-forming chamber 12.

In the CVD film-forming apparatus 11, after the processing substrate is introduced into the substrate conveying chamber 15, the organometallic compounds in the material gas line 14B are bypassed through the valve V2 to the exhaust system 13 while the processing substrate is heated up to a desired processing temperature. The formation of an initial layer immediately after the start of film formation can be prevented by providing the bypass valve V2.

SUMMARY OF THE INVENTION

The conventional technology for a ferroelectric or high-K dielectric film is no better than a laboratory-level one using a single CVD apparatus having a single film-forming chamber as shown in FIG. 1. In the case of using such a CVD apparatus for mass production, the productivity is inevitably reduced significantly. Particularly, it takes time to raise the temperature of the processing substrate to a desired processing temperature after introducing the processing substrate into the film-formation chamber, so that the throughput of substrate processing is decreased.

Further, as previously described, in the conventional CVD film-forming apparatus 11, the bypass valve V2 is provided to stabilize material supply immediately after the start of film formation, thereby preventing the formation of an initial layer. Provision of a bypass valve, however, is not necessarily limited to the CVD film-forming apparatus forming a ferroelectric or high-K dielectric film. In recent semiconductor devices, the film thickness of a formed CVD film is reduced as the semiconductor devices are miniaturized, so that the performance of the semiconductor devices is greatly affected by a formation of a slight initial layer. Therefore, it is becoming almost impossible to obtain sufficient results with the configuration using the bypass valve V2 as shown in FIG. 1.

Particularly, in MOCVD processing for a ferroelectric or high-K dielectric film, MOCVD material is dissolved in a solvent to be further vaporized, so that the material is supplied to the film-forming chamber. It is necessary to vaporize the material continuously without suspension so that processing is stably started even after changing processing substrates. In the case of forming a PZT film, for instance, it is required to supply Pb organometallic compound material such as $Pb(DPM)_2$, Zr organometallic compound material such as $Zr(DPM)_4$, and Ti organometallic compound material such as $Ti(O\text{-}iPr)_2(DPM)_2$ simultaneously with a predetermined ratio of flow rates. If the vaporization is suspended, however, the ratio of flow rates may deviate from a predetermined value. Further, the ferroelectric or high-K dielectric film is an oxide film, and an oxygen deficiency is easily formed therein. Therefore, when the flow rates of the organometallic materials vary, the formed ferroelectric or high-K dielectric film may include an oxygen deficiency so as to be prevented from performing a desired function. The configuration of FIG. 1 is not practical particularly in the MOCVD process for a ferroelectric or high-K dielectric film in which such control of film quality is very important.

For the above-described reason, the organometallic compound materials are also vaporized continuously while raising the temperature of a processing substrate in the MOCVD process for a ferroelectric or high-K dielectric film. In the configuration of FIG. 1, the materials are not used for actual processing during that period, and therefore, wasted. The organometallic compound materials for a ferroelectric or high-K dielectric film are very expensive, so that such wasting of the materials contributes to a rise in the production costs of semiconductor devices.

Accordingly, it is a general object of the present invention to provide a method of forming a semiconductor device in which the above-described disadvantages are eliminated.

A more specific object of the present invention is to provide a method and apparatus capable of stably forming a film on a substrate with high throughput.

Another more specific object of the present invention is to provide a method of forming a semiconductor device, which method, in manufacturing a semiconductor device including a ferroelectric or high-K dielectric film, includes the step of forming the ferroelectric or high-K dielectric film by MOCVD and is capable of stably forming the ferroelectric or high-K dielectric film with high throughput in the form of a crystallized film.

The above objects of the present invention are achieved by a method of manufacturing a semiconductor device, the method including the steps of (a) introducing a first processing substrate into a first CVD film-forming chamber, (b) raising a temperature of the first processing substrate to a predetermined processing temperature in the first CVD film-forming chamber, (c) growing a first film on the first processing substrate in the first CVD film-forming chamber by supplying vapor phase material in a material line to the first CVD film-forming chamber, (d) introducing a second processing substrate into a second CVD film-forming chamber, (e) raising a temperature of the second processing substrate to the predetermined processing temperature in the second CVD film-forming chamber, and (f) growing a second film on the second processing substrate in the second CVD film-forming chamber by supplying the vapor phase material in the material line to the second CVD film-forming chamber, wherein step (c) includes the step of supplying the vapor phase material in the material line selectively to the first CVD film-forming chamber, step (f) includes the step of supplying the vapor phase material in the material line selectively to the second CVD film-forming chamber, and step (f) is performed after step (c) by switching, from the first CVD film-forming chamber to the second CVD film-forming chamber, a chamber to which the vapor phase material in the material line is supplied so that a pressure of the vapor phase material in the material line is maintained at a substantially constant value.

The above objects of the present invention are also achieved by a film-forming method using a gas supply source and first and second film-forming chambers connected thereto, the film-forming method placing first and second substrates inside the first and second film-forming chambers, respectively, and forming a thin film on a surface of each of the first and second substrates by introducing material gas for the thin films from the gas supply source into the first and second film-forming chambers while evacuating the first and second film-forming chambers, wherein a dummy film-forming chamber different from the first and second film-forming chambers is provided so as to be connected to the gas supply source, and at a time of completing the formation of the thin film on the first substrate in the first film-forming chamber while continuing the formation of the thin film on the second substrate in the second film-forming chamber, the dummy film-forming chamber is pre-evacuated so that the material gas equal in amount to the material gas introduced into the first film-forming chamber is introduced from the gas supply source into the pre-evacuated dummy film-forming chamber while the introduction of the material gas into the first-film forming chamber is suspended.

The above objects of the present invention are further achieved by a film-forming apparatus including: a first CVD film-forming chamber capable of, after a first processing substrate is introduced thereinto, raising a temperature of the first processing substrate to a predetermined processing temperature and forming a first film on the first processing substrate while supplying vapor phase material in a material line to the first CVD film-forming chamber; and a second CVD film-forming chamber capable of, after a second processing substrate is introduced thereinto, raising a temperature of the second processing substrate to the predetermined processing temperature and forming a second film on the second processing substrate while supplying the vapor phase material in the material line to the second CVD film-forming chamber, wherein the vapor phase material in the material line is supplied selectively to the first film-forming chamber in growing the first film on the first processing substrate in the first film-forming chamber, a chamber to which the vapor phase material in the material line is supplied is switched from the first film-forming chamber to the second film-forming chamber after the first film is formed on the first processing substrate in the first film-forming chamber in growing the second film on the second processing substrate in the second film-forming chamber, and the switching of the chamber to which the vapor phase material is supplied is performed so that a pressure of the vapor phase material in the material line is maintained at a substantially constant value.

According to the present invention, first and second CVD film-forming chambers are provided so that CVD film formation is performed alternately in the first and second film-forming chambers. Thereby, high throughput suitable for mass production can be realized. In the present invention, in switching the chamber to which material gas is supplied between the first and second film-forming chambers, no variation is caused in the pressure of the material gas in its supply line so that the material gas is supplied with stability, thereby preventing undesired unevenness due to such as an initial layer from being generated in the formed CVD film. The present invention is effective particularly in the process for forming a ferroelectric or high-K dielectric film, which process requires a plurality of vapor phase materials to be supplied simultaneously and the vapor phase materials to be vaporized in vaporizers.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given, with reference to the accompanying drawings, of embodiments of the present invention.

First Embodiment

Figure 1:
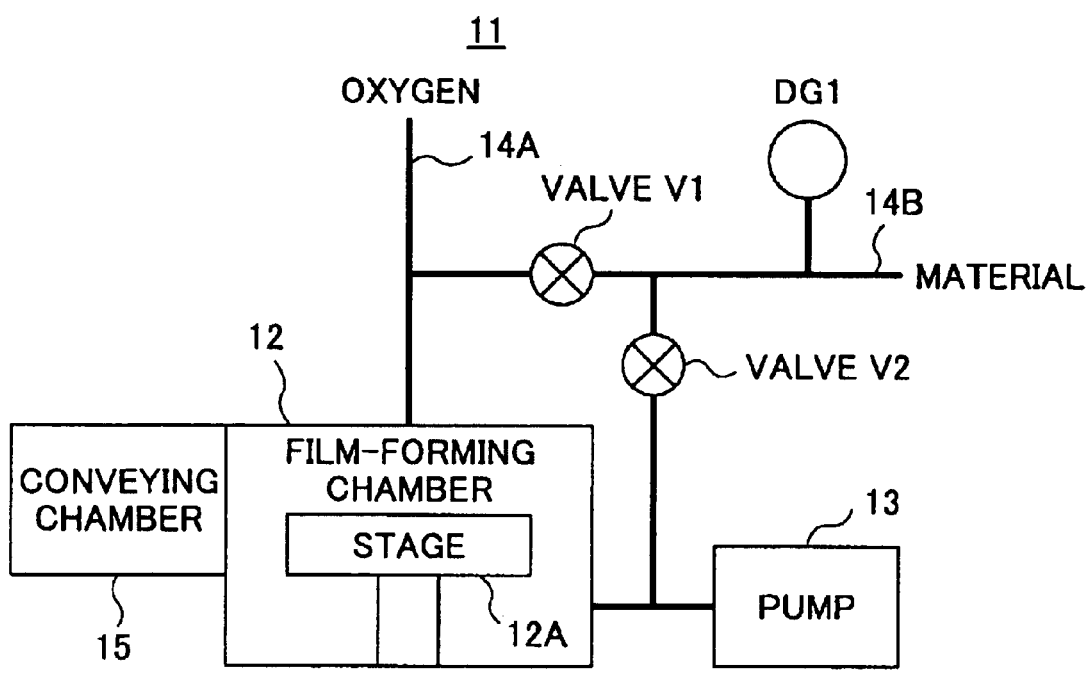
FIG. 1 is a diagram showing the configuration of a conventional CVD film-forming apparatus.
Figure 2A:
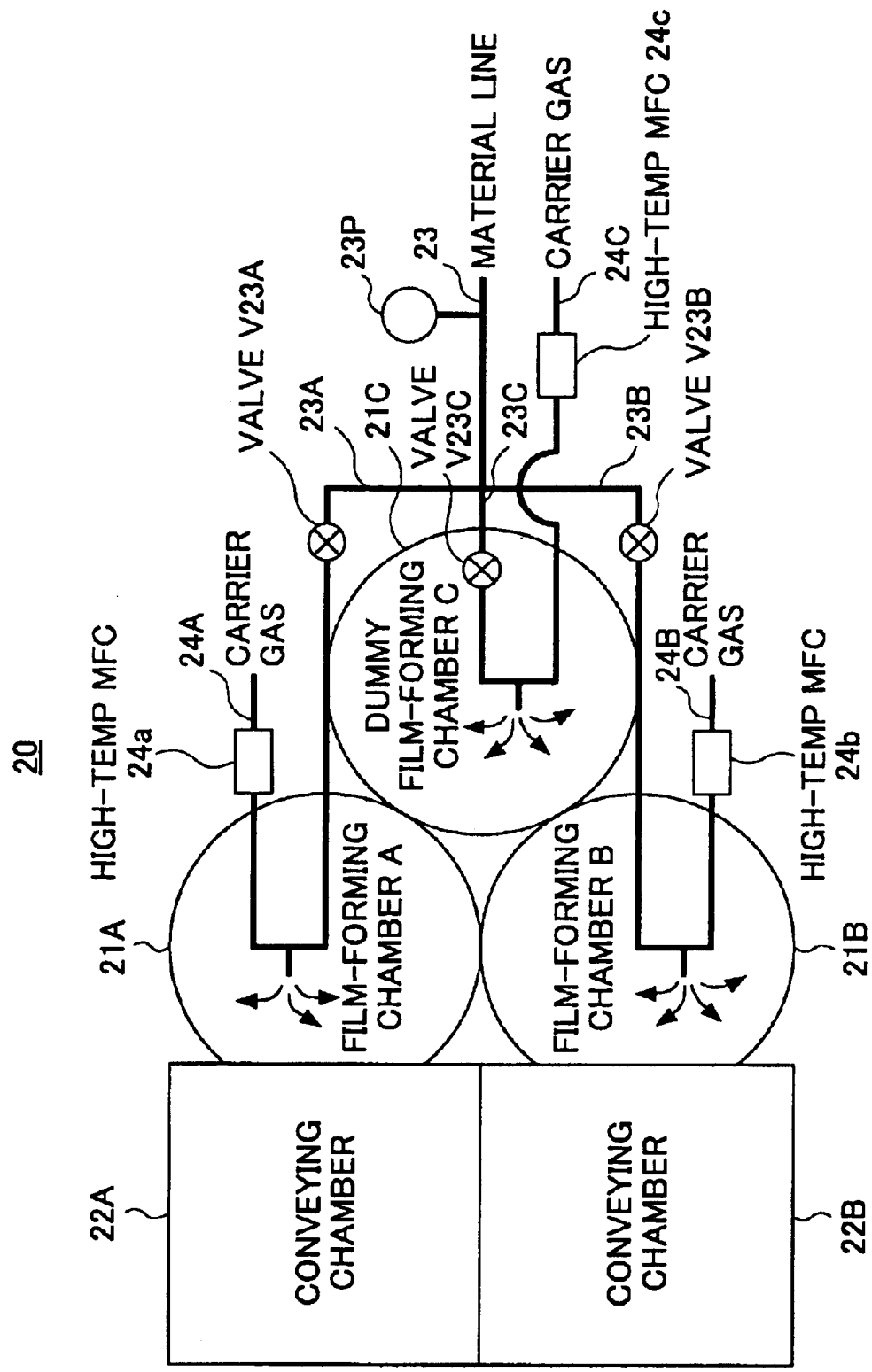
FIGS. 2A and 2B are diagrams showing the configuration of a CVD film-forming apparatus according to a first embodiment of the present invention.
Figure 2B:
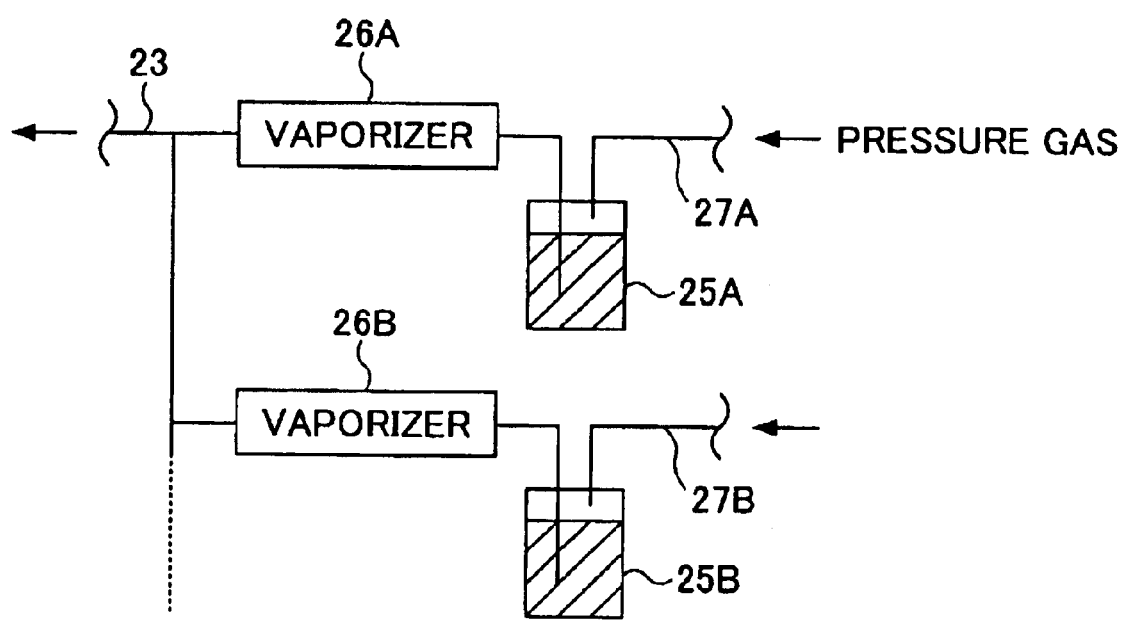

FIGS. 2A and 2B are diagrams showing the configuration of a CVD film-forming apparatus 20 according to a first embodiment of the present invention. FIG. 2A shows the configuration of the CVD film-forming apparatus 20 around its film-forming chambers. FIG. 2B shows the configuration of part of its material supply system which part includes material containers and vaporizers.

According to FIG. 2A, the CVD film-forming apparatus 20 includes first and second film-forming chambers 21A and 21B, which are connected to substrate conveying chambers 22A and 22B, respectively. In addition to the first and second film-forming chambers 21A and 21B, the CVD film-forming apparatus 20 includes a dummy film-forming chamber 21C to which no substrate semiconductor conveying chamber is connected.

Figure 3:
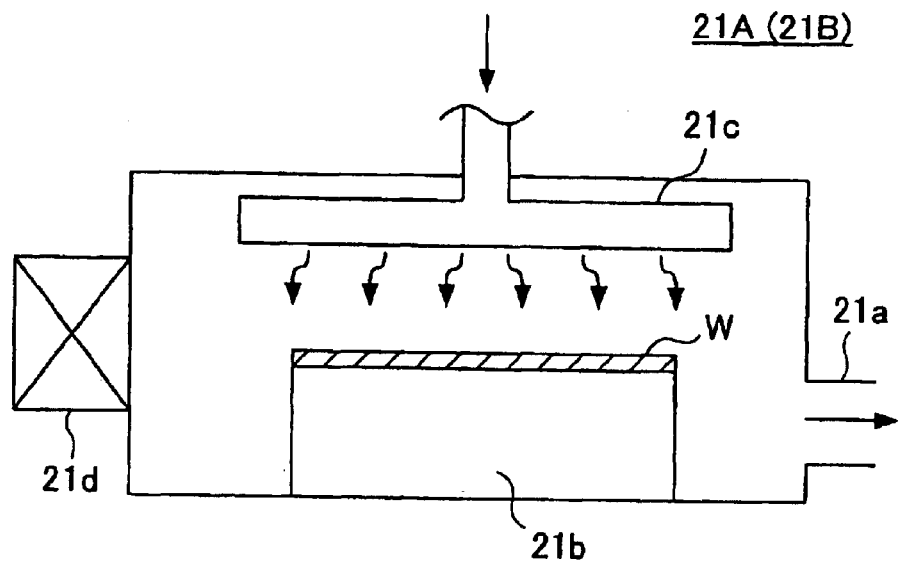
FIG. 3 is a diagram showing the configuration of a CVD film-forming chamber used in the CVD film-forming apparatus of FIGS. 2A and 2B according to the first embodiment of the present invention.

As shown in FIG. 3, each of the CVD film-forming chambers 21A and 21B is evacuated through an exhaust port 21a, and has a stage 21b for holding a substrate to be processed (hereinafter a processing substrate) W formed therein. Although not graphically represented, the stage 21b includes a temperature control mechanism controlling the temperature of the processing substrate W. Further, in each of the CVD film-forming chambers 21A and 21B, a shower head 21c for introducing material gas is provided to oppose the stage 21b, and a gate valve 21d for conveying in or out the processing substrate W is provided.

Figure 4:
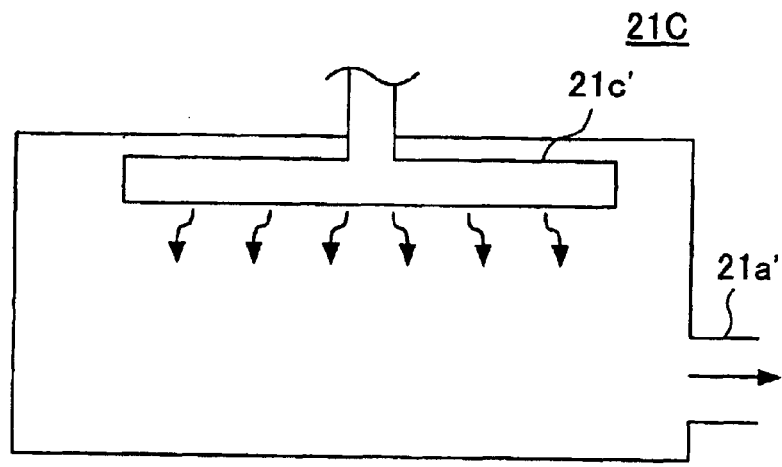
FIG. 4 is a diagram showing the configuration of a dummy CVD film-forming chamber used in the CVD film-forming apparatus of FIGS. 2A and 2B according to the first embodiment of the present invention.

On the other hand, no processing substrate is introduced into the dummy film-forming chamber 21C. As shown in FIG. 4, the dummy film-forming chamber 21C includes a shower head 21c' and an exhaust port 21a' corresponding to the shower head 21c and the exhaust port 21a, respectively, but has neither gate valve 21d' corresponding to the gate valve 21d nor stage 21b' corresponding to the stage 21b.

FIG. 2B shows the configuration of the material supply system of the CVD film-forming apparatus 20.

According to FIG. 2B, in the case of forming a PZT film in the CVD film-forming apparatus 20, the material supply system includes material containers 25A, 25B, . . . and pressure lines 27A, 27B, . . . pressurizing the material containers 25A, 25B, . . . , respectively. The material containers 25A, 25B, . . . contain liquid material where organometallic compound materials such as $Pb(DPM)_2$, $Zr(DPM)_4$, and $Ti(O-iPr)_2(DPM)_2$ are dissolved in a solvent such as THF. The material containers 25A, 25B, . . . send the liquid material to corresponding vaporizers 26A, 26B, . . . , respectively, so that the liquid material is vaporized into vapor phase material.

The vapor phase material thus formed is supplied as material gas to the CVD film-forming chamber 21A or 21B or to the dummy film-forming chamber 21C through a material (gas) supply line 23.

More specifically, the material supply line 23 is divided into lines 23A, 23B, and 23C as shown in FIG. 2A. The material gas supplied to the line 23A is supplied through a valve V23A to the CVD film-forming chamber 21A together with Ar or $N_2$ carrier gas supplied from a line 24A via a high-temperature mass flow controller (MFC) 24a.

On the other hand, the material gas supplied to the line 23B is supplied through a valve V23B to the CVD film-forming chamber 21B together with the Ar or $N_2$ carrier gas supplied from a line 24B via a high-temperature MFC 24b. Further, the material gas supplied to the line 23C is supplied through a valve V23C to the dummy film-forming chamber 21C together with the Ar or $N_2$ carrier gas supplied from a line 24C via a high-temperature MFC 24c.

Figure 5:
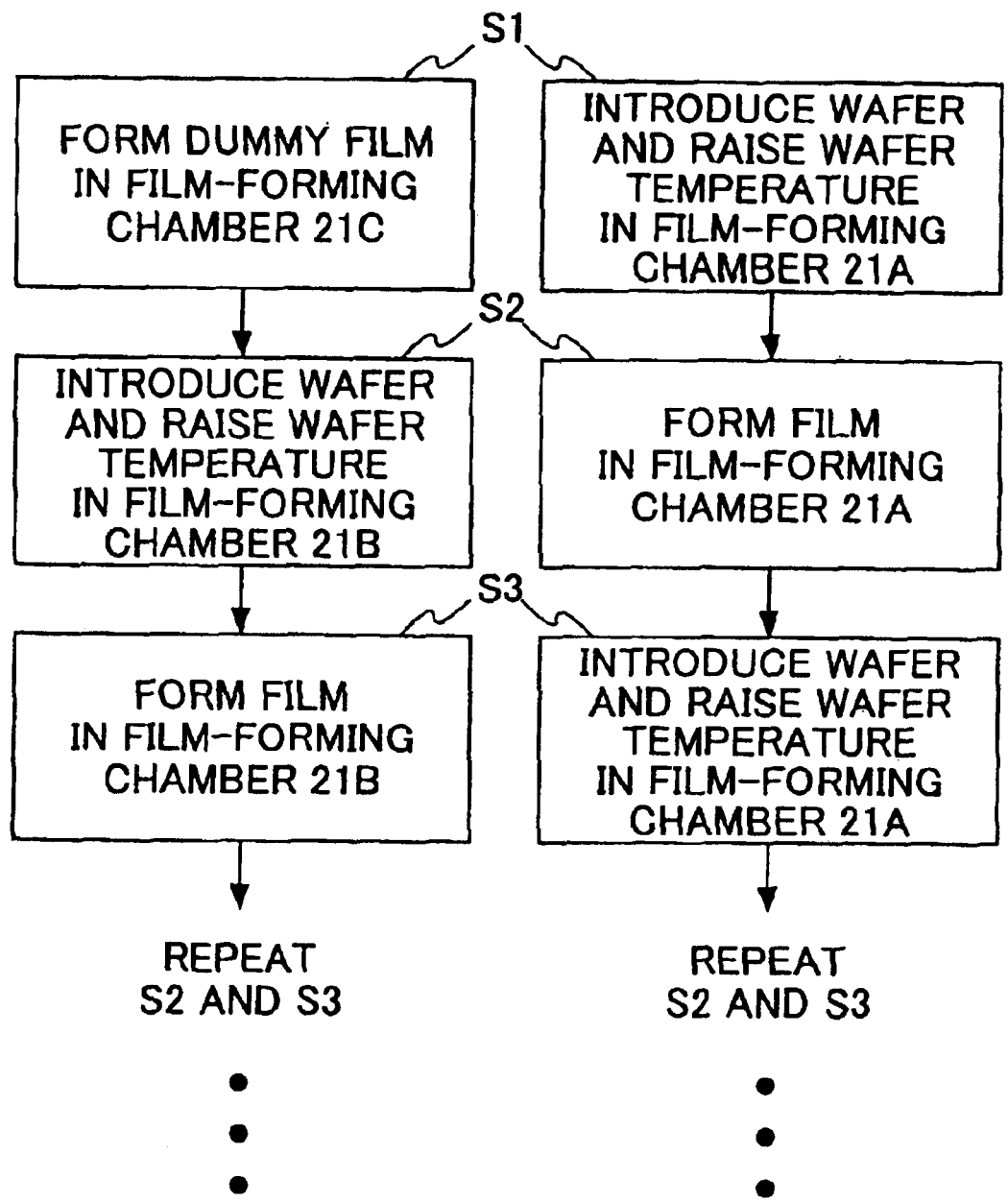
FIG. 5 is a flowchart showing a sequence of continuous CVD processing using the CVD film-forming apparatus of FIGS. 2A and 2B according to the first embodiment of the present invention.

FIG. 5 is a flowchart showing the outline of a film formation process performed in the CVD film-forming apparatus 20 of FIGS. 2A and 2B.

In step S1 of FIG. 5, the material gas is supplied selectively to the dummy film-forming chamber 21C via the valve V23C so that a dummy deposition process is performed. At the same time, a first processing substrate is introduced into the CVD film-forming chamber 21A so as to be heated up to a predetermined processing temperature. At this point, the carrier gas is supplied selectively to the CVD film-forming chamber 21A through a valve. In the dummy deposition process, however, the material gas introduced into the dummy film-forming chamber 21C is immediately evacuated therefrom, so that no deposition actually occurs.

Next, in step S2, the material gas is supplied selectively to the CVD film-forming chamber 21A via the valve V23A, so that a film is formed on the first processing substrate. At the same time, a second processing substrate is introduced into the CVD film-forming chamber 21B so as to be heated up to the predetermined processing temperature. At this point, the carrier gas is supplied selectively to the CVD film-forming chamber 21B through a valve.

Further, in step S3, the material gas is supplied selectively to the CVD film-forming chamber 21B via the valve V23B, so that a film is formed on the second processing substrate. At the same time, another first processing substrate is introduced into the CVD film-forming chamber 21A so as to be heated up to the predetermined processing temperature. At this point, the carrier gas is supplied selectively to the CVD film-forming chamber 21A through a valve.

By further repeating steps S2 and S3 alternately, substrate processing is performed with good efficiency, that is, with high throughput.

In the process of FIG. 5, while a film is being formed in the film-forming chamber 21A, wafers (processing substrates) are changed and the temperature of a new wafer is raised in the film-forming chamber 21B. Further, while a film is being formed in the film-forming chamber 21B, wafers are changed and the temperature of a new wafer is raised in the film-forming chamber 21A. By thus not only changing wafers but also raising the temperature of a new wafer in one film-forming chamber while forming a film in another film-forming chamber, the problems of deterioration of film quality and peeling due to a rapid rise in temperature can be avoided particularly in the case of forming a W film. Meanwhile, in the case of forming a metal film that is difficult to oxidize or in the case where the element structure can avoid metal oxidation, it is possible to rapidly raise the temperature of a wafer in the film-forming chamber 21B after the film formation process in the film-forming chamber 21A. Likewise, it is also possible to rapidly raise the temperature of a wafer in the film-forming chamber 21A after the film formation process in the film-forming chamber 21B.

Second Embodiment

Thus, by applying the processing sequence of FIG. 5 to the CVD film-forming apparatus 20 of FIGS. 2A and 2B, a semiconductor device having a ferroelectric or high-K dielectric film can be manufactured efficiently. Particularly, in the case of forming a ferroelectric or high-K dielectric film such as a PZT film, as previously described, it is required to control switching of the valves V23A through V23C so that the pressure of the material gas inside the material supply line 23 does not vary. If the pressure of the material gas increases in the gas supply line 23, the flow rate of the material gas decreases.

Figure 6:
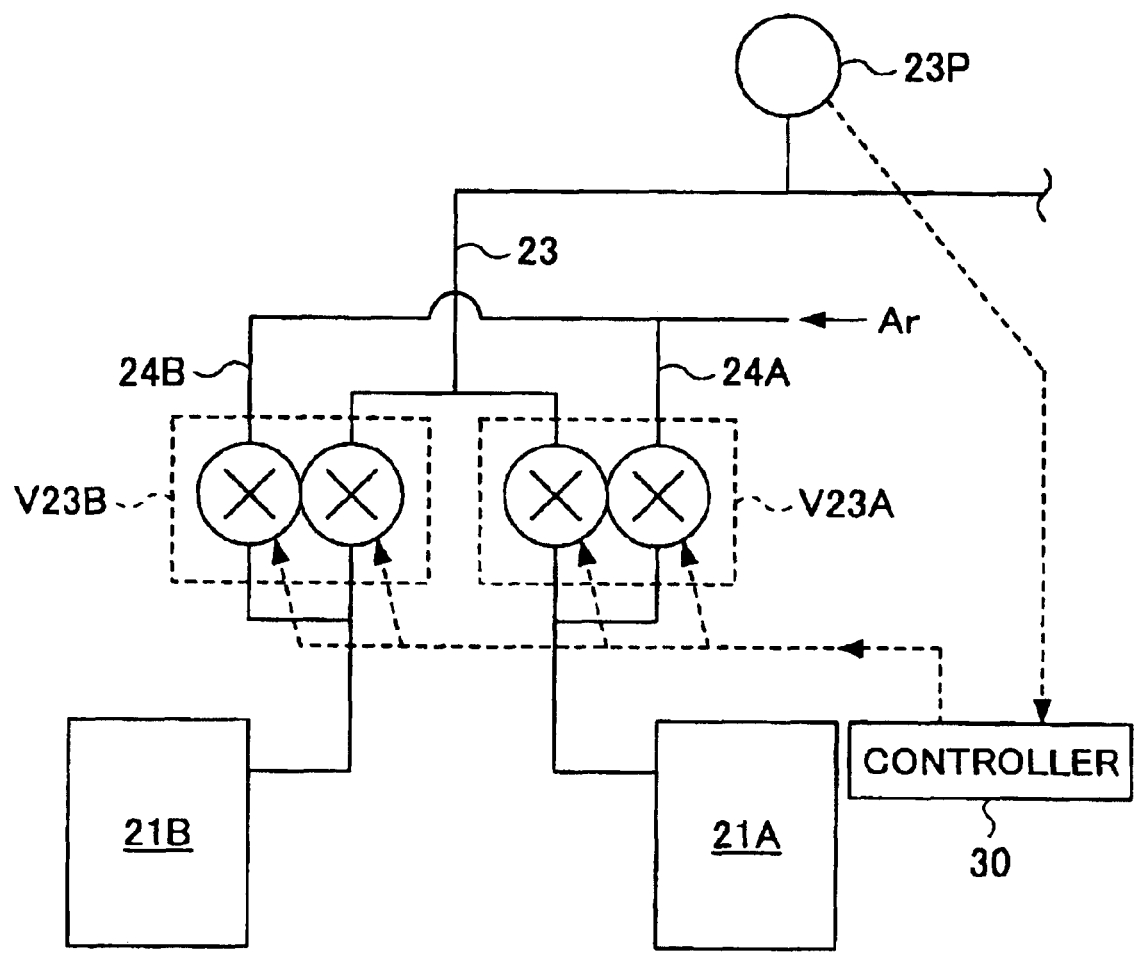
FIG. 6 is a diagram showing the configuration of a CVD apparatus according to a second embodiment of the present invention.
Figure 7:
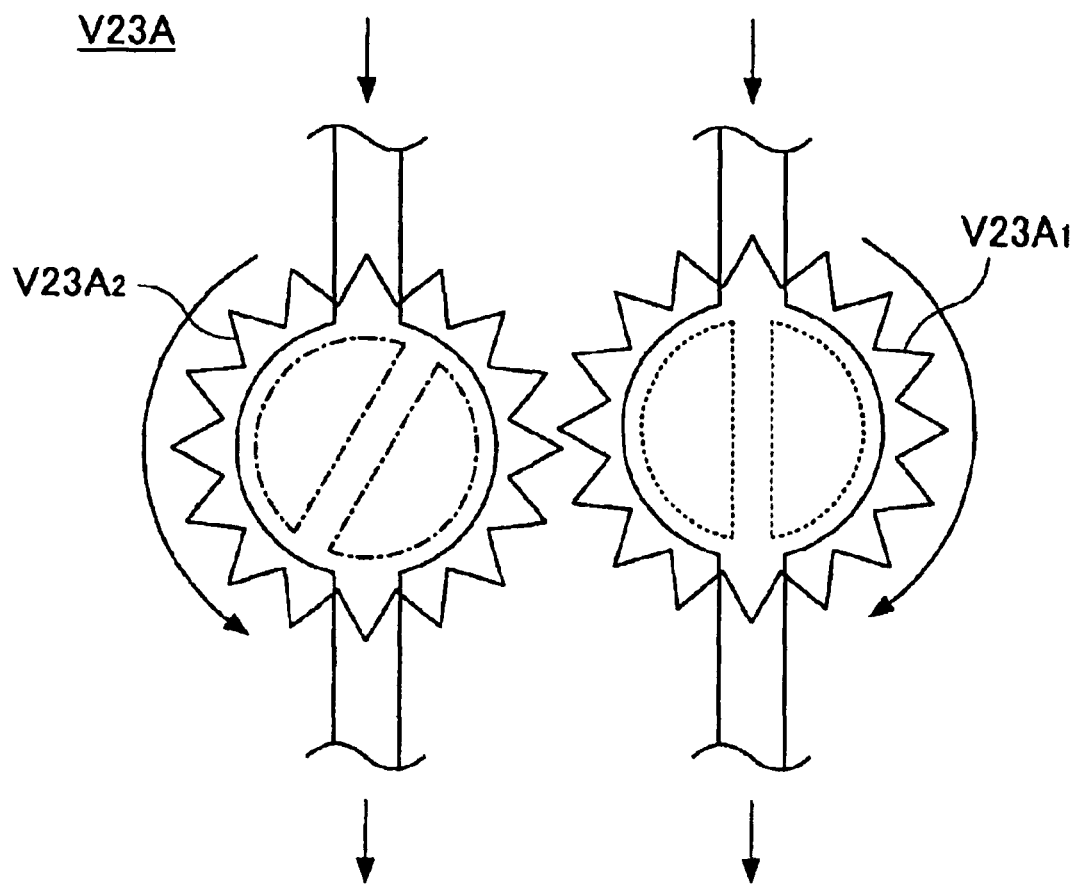
FIG. 7 is a diagram showing the configuration of a gas switching valve used in the CVD apparatus of FIG. 6 according to the second embodiment of the present invention.

FIGS. 6 and 7 are diagrams showing the configuration of a CVD deposition apparatus that can eliminate variation in the pressure in the material supply line 23 particularly at the time of valve switching according to a second embodiment of the present invention. In the drawings, the same elements as those previously described are referred to by the same numerals, and a description thereof will be omitted. In this embodiment, the dummy film-forming chamber 21C is omitted for the purpose of simplification. However, a configuration including the dummy film-forming chamber 21C can be realized easily.

According to FIG. 6, in this embodiment, the valve V23A forms a switching valve that switches the carrier gas and the material gas supplied to the CVD film-forming chamber 21A. Likewise, the valve V23B forms a switching valve that switches the carrier gas and the material gas supplied to the CVD film-forming chamber 21B.

The switching valves V23A and V23B are controlled by a controller 30 based on the output of a pressure gauge 23P connected to the material supply line 23 so as to monitor the pressure of the material gas inside the material supply line 23 so that the carrier gas such as Ar is supplied to the CVD film-forming chamber 21B when the material gas is supplied to the CVD film-forming chamber 21A and to the CVD film-forming chamber 21A when the material gas is supplied to the CVD film-forming chamber 21B.

FIG. 7 is a diagram showing the configuration of the switching valve V23A in detail.

According to FIG. 7, the valve V23A is actually formed of two conductance valves $V23A_1$ and $V23A_2$. The valves $V23A_1$ and $V23A_2$ engage each other through gears so as to be driven so that the valve $V23A_2$ is closed when the valve $V23A_1$ is opened and the valve $V23A_1$ is closed when the valve $V23A_2$ is opened. The switching valve V23B has the same configuration.

Figure 8:
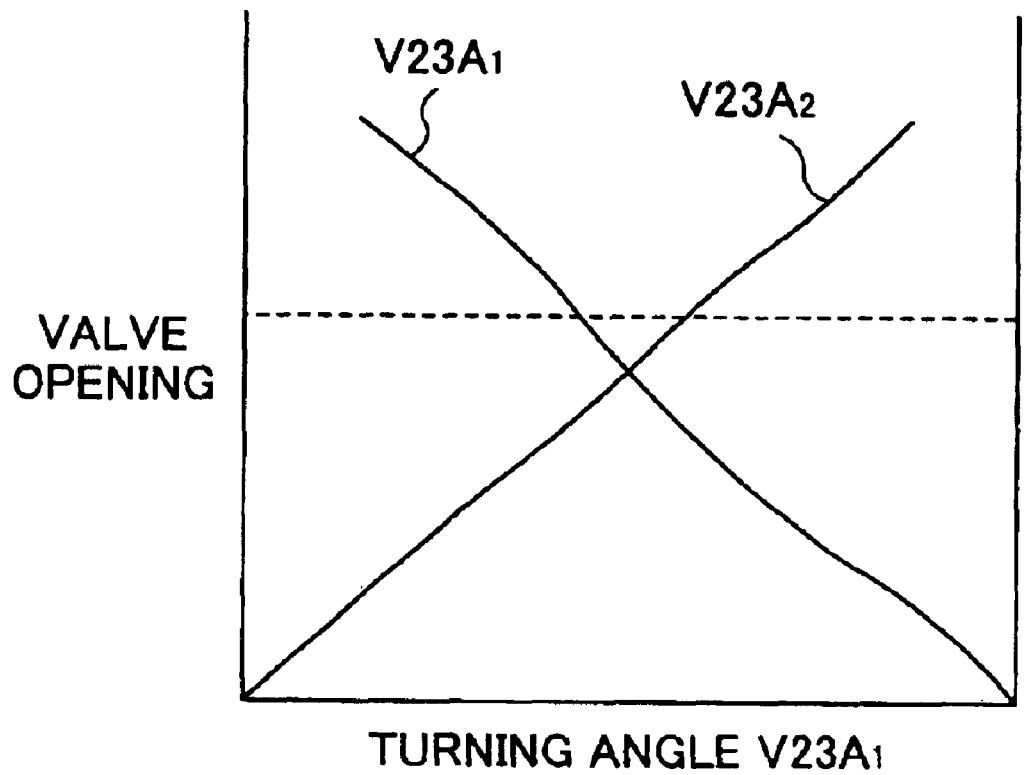
FIG. 8 is a graph showing the characteristic of the switching valve of FIG. 7 according to the second embodiment of the present invention.

FIG. 8 is a graph showing the characteristic of the switching valve V23A of FIG. 7.

According to FIG. 8, as the valve $V23A_1$ is turned, the opening of the valve $V23A_2$ increases while the opening of the $V23A_1$ decreases.

The same applies to the switching valve V23B. As a result, the pressure of the material gas inside the material supply line 23 is kept constant, so that film deposition is stably performed even when the CVD film-forming chambers 21A and 21B are switched as a film-forming chamber to which the material gas is supplied. Thereby, the problem of the formation of an initial layer can be avoided.

Third Embodiment

Figure 9:
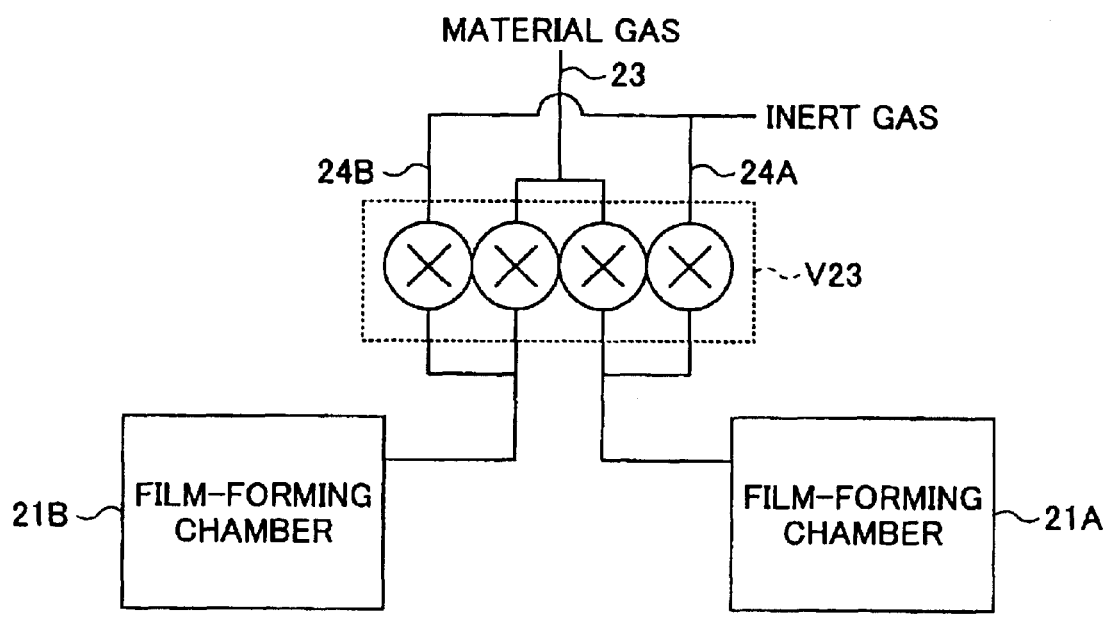
FIG. 9 is a diagram showing the configuration of a CVD film-forming apparatus according to a third embodiment of the present invention.

FIG. 9 is a diagram showing a CVD film-forming apparatus according to a third embodiment of the present invention. In FIG. 9, the same elements as those previously described are referred to by the same numerals, and a description thereof will be omitted.

According to FIG. 9, the CVD film-forming apparatus of this embodiment includes the CVD film-forming chambers 21A and 21B. The film-forming chamber to which the material gas in the material supply line 23 and the carrier gas in the lines 24A and 24B are supplied can be switched selectively between the CVD film-forming chambers 21A and 21B by a four-way switching valve V23.

Figure 10:
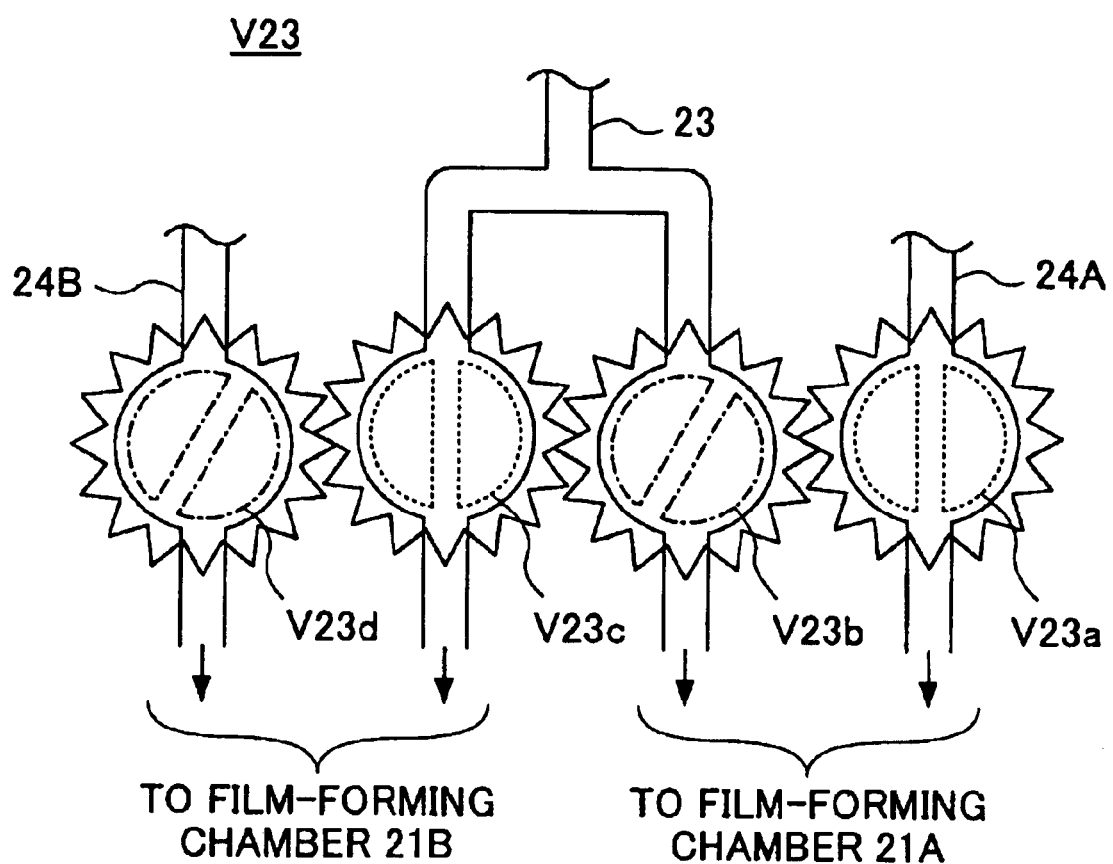
FIG. 10 is a diagram showing a gas switching valve used in the CVD film-forming apparatus of FIG. 9 according to the third embodiment of the present invention.

FIG. 10 is a diagram showing the configuration of the four-way switching valve V23 shown in FIG. 9.

According to FIG. 10, the switching valve V23 is formed of conductance valves V23a through V23d successively engaged by gears. The material gas is supplied from the material supply line 23 to the conductance valves V23b and V23c. The carrier gas is supplied from the lines 24A and 24B to the conductance valves V23a and V23d, respectively. The conductance valves V23a and V23b are connected to the CVD film-forming chamber 21A and the conductance valves V23c and V23d are connected to the CVD film-forming chamber 21B.

The conductance valves V23b and V23c are driven in the opposite directions, so that the valve V23c is closed when the valve V23b is opened and the valve V23b is closed when the valve V23c is opened. The valves V23a and V23b are driven in the opposite directions as in the second embodiment, and the valves V23c and V23d are driven in the opposite directions.

Figure 11:
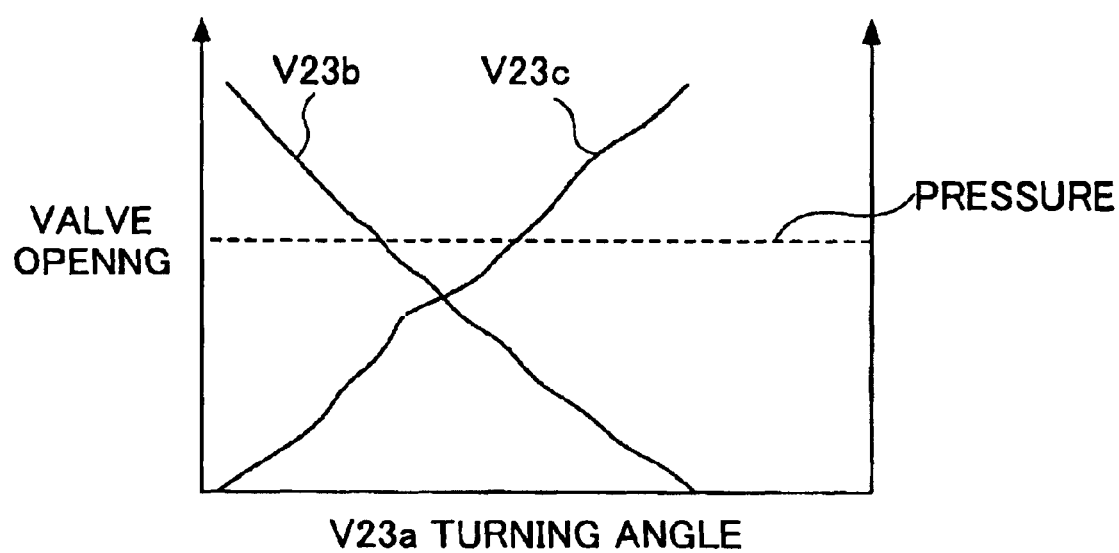
FIG. 11 is a graph showing the characteristic of the switching valve of FIG. 10 according to the third embodiment of the present invention.

FIG. 11 is a graph showing the relationship between the turning angle of the conductance valve V23a and the openings of the conductance valves V23b and V23c in the four-way switching valve V23.

As shown in FIG. 11, as the opening of the valve V23b decreases, the opening of the valve V23c increases, so that the pressure of the material gas inside the material supply line 23 is kept constant. As a result, film deposition is stably performed even when there is a switching between the CVD film-forming chambers 21A and 21B as the film-forming chamber to which the material gas is supplied. Thereby, the problem of the formation of an initial layer can be avoided.

Fourth Embodiment

Figure 12:
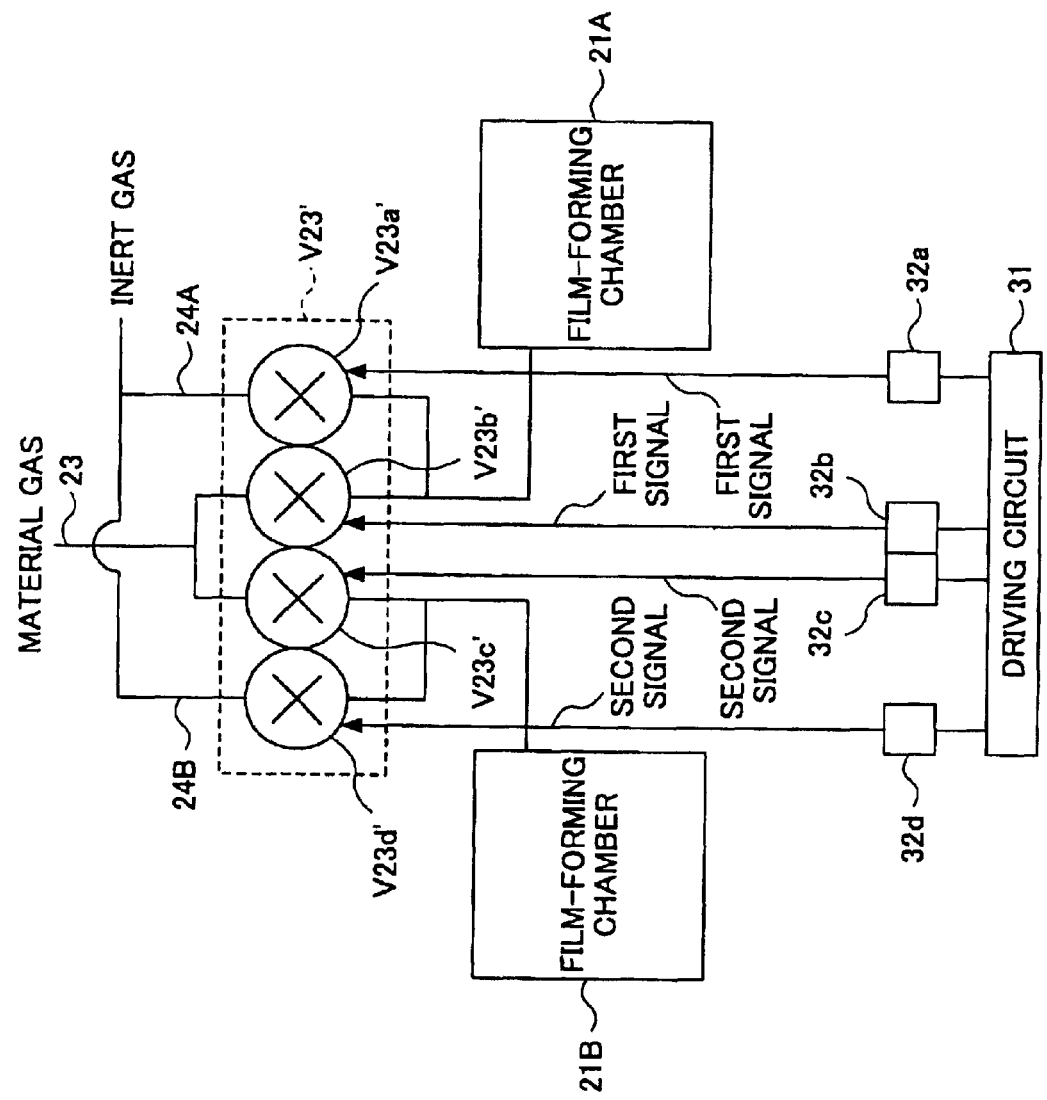
FIG. 12 is a diagram showing the configuration of a CVD film-forming apparatus according to a fourth embodiment of the present invention.

FIG. 12 is a diagram showing the configuration of a CVD film-forming apparatus according to a fourth embodiment of the present invention. In FIG. 12, the same elements as those previously described are referred to by the same numerals, and a description thereof will be omitted.

According to FIG. 12, in this embodiment, the four-way switching valve V23 of FIG. 9 is replaced by a switching valve V23' formed of ON-OFF valves V23a' through V23d' driven through mounted control units 32a through 32d, respectively, by a driving circuit 31. In this embodiment, the ON-OFF valves V23a', V23b', V23c', and V23d' correspond to the valves V23a, V23b, V23c, and V23d of the second embodiment, respectively.

Figure 13A:
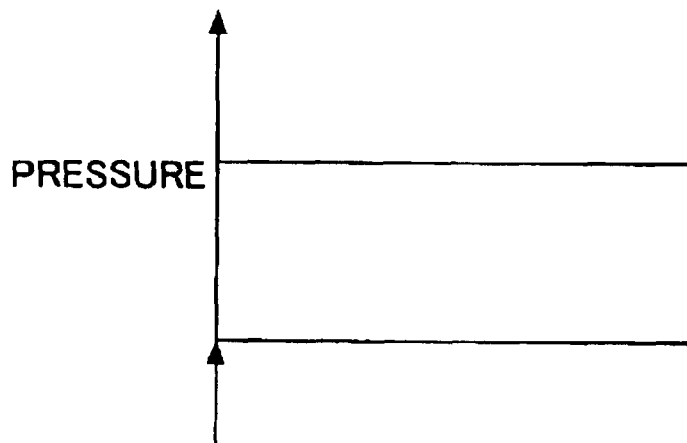
FIGS. 13A through 13C are diagrams showing the operations of switching valves used in the CVD film-forming apparatus according to the fourth embodiment of the present invention.
Figure 13B:
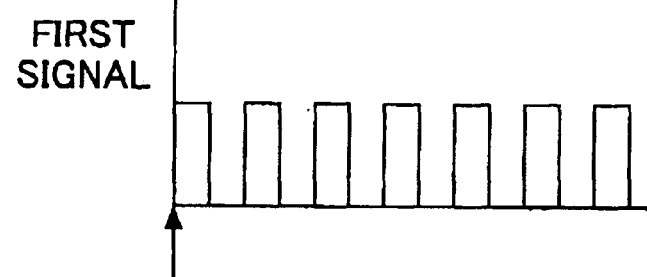
Figure 13C:
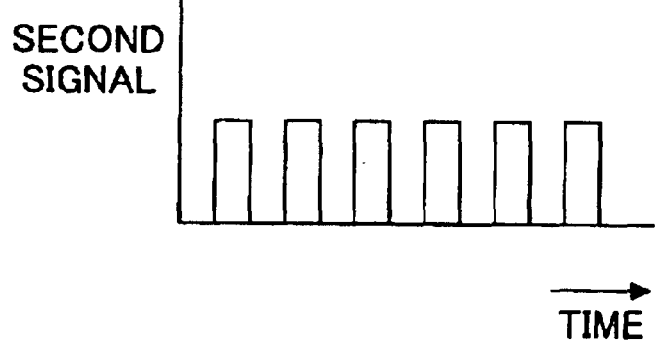

FIGS. 13A through 13C are diagrams showing control of the ON-OFF valves V23b' and V23c' by the driving circuit 31.

As shown in FIGS. 13B and 13C, the mounted control unit 32b is controlled by the driving circuit 31 so as to form a first driving signal pulse, while the mounted control unit 32c forms a second driving signal pulse so that the second driving signal pulse rises at the falling edge of the first driving signal pulse. Further, the first driving signal pulse rises at the falling edge of the second driving signal pulse.

Thus, in this embodiment, the CVD film-forming chambers 21A and 21B can be switched instantaneously as the film-forming chamber to which the material gas is supplied. Thereby, the pressure of the material gas inside the material supply line 23 can be kept constant as shown in FIG. 13A.

Fifth Embodiment

Figure 14:
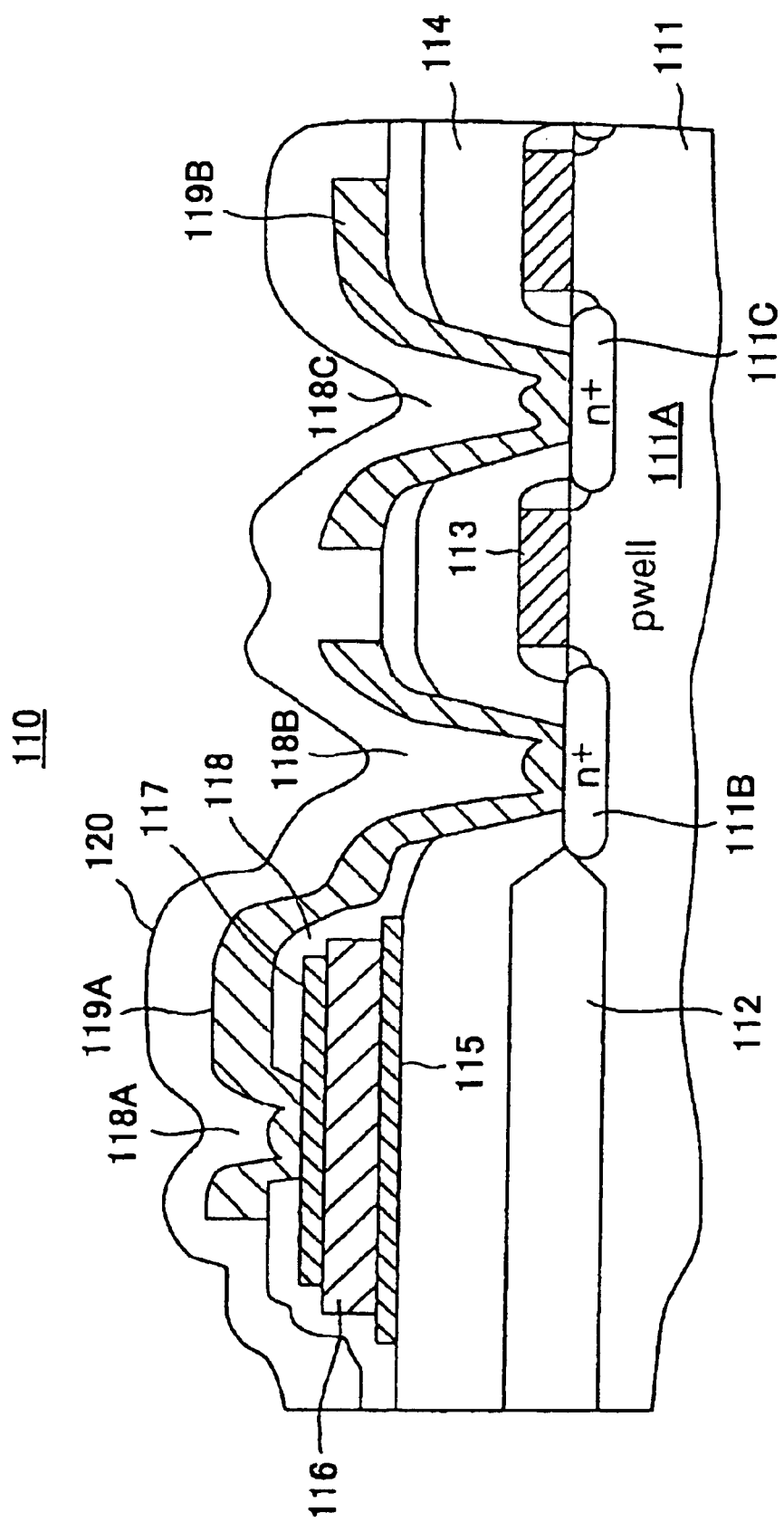
FIG. 14 is a diagram showing the configuration of a ferroelectric memory device according to a fifth embodiment of the present invention.

FIG. 14 is a diagram showing the configuration of a ferroelectric memory device 110 according to a fifth embodiment of the present invention. The ferroelectric memory device 110 includes a ferroelectric film formed by any of the CVD film-forming apparatuses according to the above-described first through fourth embodiments.

According to FIG. 14, the ferroelectric memory device 110 is formed on a Si substrate 111 on which a p-type well 111A is formed, partitioned by an isolation region 112. In a device region formed of the p-type well 111A, a gate electrode 113 is formed on a gate insulating film (not shown in the drawing) as a word line so as to correspond to the channel region. Further, in the device region, n$^+$-type diffusion regions 111B and 111C are formed on both sides of the gate electrode 113 in the Si substrate 111.

The gate electrode 113 is covered with an interlayer insulating film 114. A contact hole 118C is formed in the interlayer insulating film 114 so as to expose the diffusion region 111C. On the interlayer insulating film 114, an electrode 119B contacting the diffusion region 111C is formed as a bit line so as to correspond to the contact hole 118C.

A lower electrode 115 is formed on the interlayer insulating film 114. A ferroelectric film 116 such as a PZT or SBT film is formed on the lower electrode 115 by using any of the CVD film-forming apparatuses according to the first through fourth embodiments.

Further, an upper electrode 117 is formed on the ferroelectric film 116. A SiO$_2$ film 118 is formed so as to cover the capacitor thus formed.

A contact hole 118A is formed in the SiO$_2$ film 118 so as to expose the upper electrode 117. A local wiring pattern 119A is formed on the SiO$_2$ film 118 so as to contact the diffusion region 111B through a contact hole 118B formed in the interlayer insulating film 114 so as to expose the diffusion region 111B.

A protection insulating film 120 is formed on the local wiring pattern 119A.

By forming the ferroelectric film 116 by any of the CVD film-forming apparatuses of the above-described embodiments, the formation of an initial layer can be prevented, the initial layer being likely to be formed around the interface with the lower electrode 115 particularly immediately after the start of film formation so as to have a composition and physical properties different from those of the other part of the ferroelectric film 116. Thereby, a ferroelectric memory device having stable characteristics can be realized.

Sixth Embodiment

Figure 15:
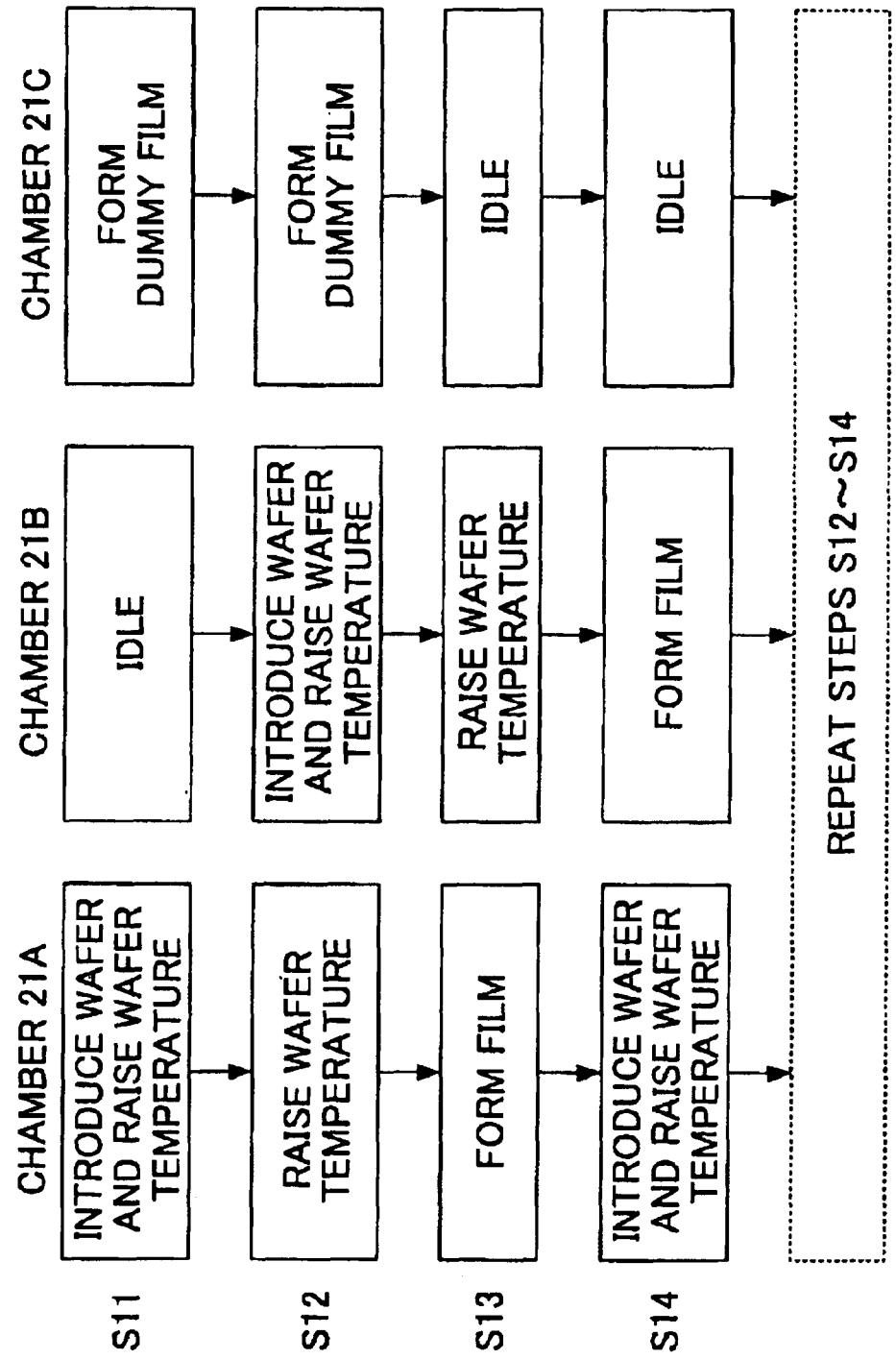
FIG. 15 is a flowchart showing a continuous sequence of film formation using the CVD film-forming apparatus of FIGS. 2A and 2B according to a sixth embodiment of the present invention.

FIG. 15 is a flowchart showing a continuous sequence of film formation using the CVD film-forming apparatus 20 of FIGS. 2A and 2B according to a sixth embodiment of the present invention.

In step S11 of FIG. 15, dummy film formation is performed in the dummy film-forming chamber 21C, while a first processing substrate is introduced into the first CVD film-forming chamber 21A so as to have its temperature raised.

Next, in step S12, the temperature of the first processing substrate continues to be raised, and at the same time, a second processing substrate is introduced into the second CVD film-forming chamber 21B so as to have its temperature raised. During this period, the material gas is supplied to the dummy film-forming chamber 21C so that the dummy film formation is performed therein.

Next, in step S13, a first CVD film is formed on the first processing substrate in the CVD film-forming chamber 21A. During this period, the temperature of the second processing substrate continues to be raised in the CVD film-forming chamber 21B.

Next, in step S14, a second CVD film is formed on the second processing substrate in the CVD film-forming chamber 21B, and at the same time, a third processing substrate is introduced into the CVD film-forming chamber 21A so as to have its temperature raised.

Further, by repeating steps S12 through S14, CVD films are formed alternately in the CVD film-forming chambers 21A and 21B.

According to the CVD film-forming process of this embodiment, the dummy film formation is repeatedly performed in the dummy film-forming chamber 21C. Therefore, although the material is used with less efficiency, this process is effective in the case where more time is required in raising the temperature of a processing substrate than in forming a film.

According to this embodiment, the dummy film formation process in the dummy film-forming chamber 21C is performed between the film formation processes in the CVD film-forming chambers 21A and 21B. Therefore, it is preferable that the dummy film-forming chamber 21C have the same configuration as the CVD film-forming chambers 21A and 21B so as to have substantially the same conductance.

Seventh Embodiment

A description will now be given, with reference to FIGS. 16 and 17, of a seventh embodiment of the present invention.

Figure 16:
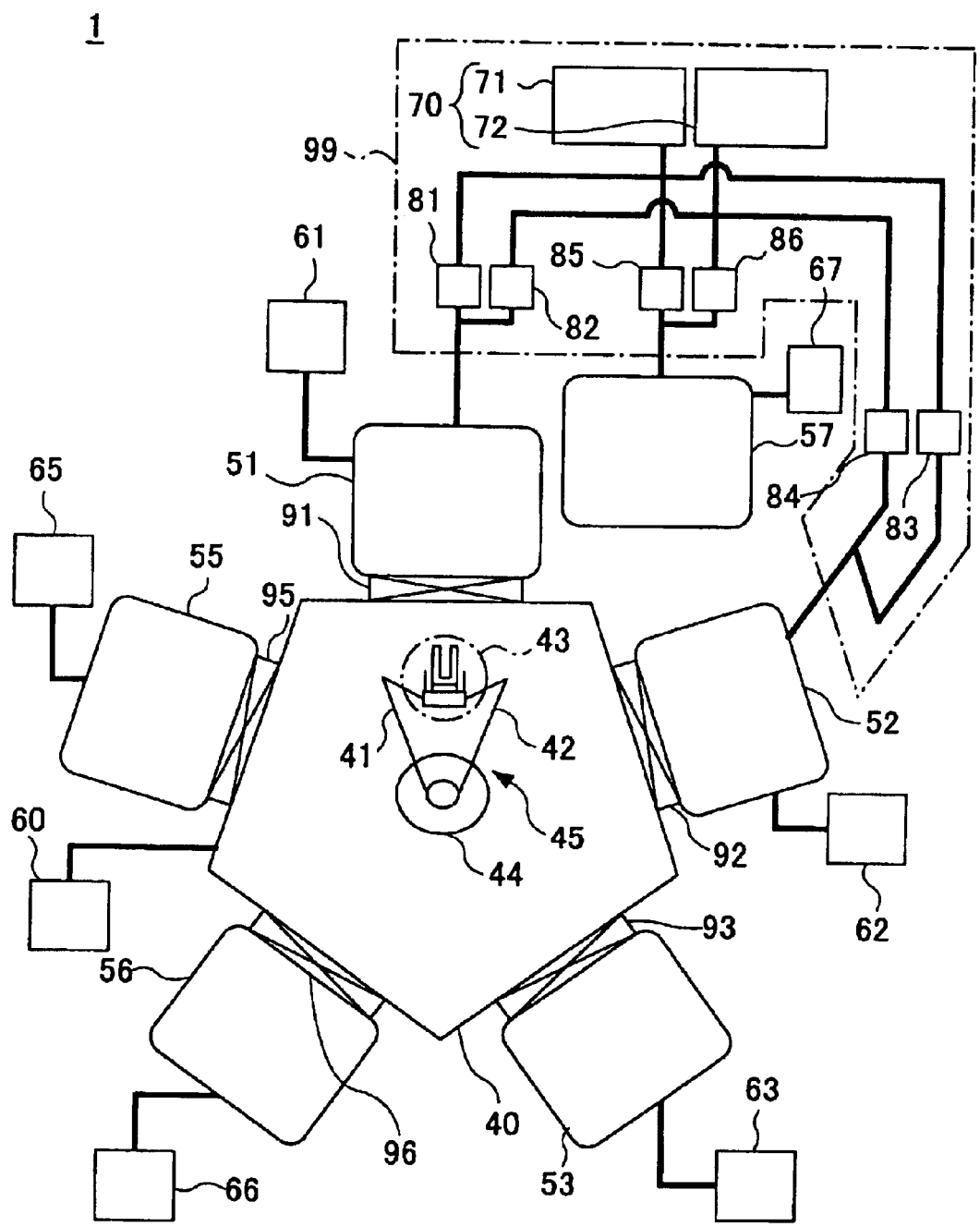
FIG. 16 is a diagram showing the configuration of a CVD apparatus according to a seventh embodiment of the present invention.

FIG. 16 is a diagram showing the configuration of a multi-chamber system 1 performing a film-forming method according to the present invention. The multi-chamber system 1 of FIG. 16 includes a transportation chamber 40 shaped like a pentagon in its plan view.

According to FIG. 16, the transportation chamber 40 is connected to first through third film-forming chambers 51 through 53, a heat chamber 55, and a conveyance chamber 56 through vacuum valves 91 through 93, 95, and 96, respectively. A transportation robot 45 is provided in the transportation chamber 40. The transportation robot 45 includes a rotatable support body 44, extendable arms 41 and 42 attached on the support body 44, and a hand 43 formed of insulating material and attached to the tips of the arms 41 and 42. The transportation robot 45 rotates the support body 44 and extends or retracts the arms 41 and 42 so that the hand 43 on the tips of the arms 41 and 42 can move among the film-forming chambers 51 through 53, the heat chamber 55, and the conveyance chamber 56. A substrate can be placed on the upper surface of the hand 43 so that the hand 43 can transport the substrate among the film-forming chambers 51 through 53, the heat chamber 55, and the conveyance chamber 56 with the substrate being placed thereon.

Vacuum exhaust systems 60 through 63, 65, and 66 are connected to the transportation chamber 40, the film-forming chambers 51 through 53, the heat chamber 55, and the conveyance chamber 56, respectively. By activating the vacuum exhaust systems 60 through 63, 65, and 66, the transportation chamber 40, the film-forming chambers 51 through 53, the heat chamber 55, and the conveyance chamber 56 can be evacuated.

Each of the film-forming chambers 51 through 53, the heat chamber 55, and the conveyance chamber 56 is connected to a gas introduction system. Gas is introduced into each of the film-forming chambers 51 through 53, the heat chamber 55, and the conveyance chamber 56 by activating the corresponding gas introduction system. Of the gas introduction systems, which, actually, are connected to all of the film-forming chambers 51 through 53, the heat chamber 55, and the conveyance chamber 56, only a gas introduction system 99 provided to the first and second film-forming chambers 51 and 52 is shown in FIG. 16.

The gas introduction system 99 includes a gas supply source 70, two material-side flow controllers 81 and 83, and two carrier-side flow controllers 82 and 84. The gas supply source 70 includes a material gas cylinder 71 and a carrier gas cylinder 72. The material gas cylinder 71 contains material gas including a metal element desired to be formed into a film. The carrier gas cylinder 72 is filled with carrier gas formed of inert gas excluding a metal element to be formed into a film.

The material-side flow controller 81 and the carrier-side flow controller 82 are provided between the first film-forming chamber 51 and the material gas cylinder 71 and between the first film-forming chamber 51 and the carrier gas cylinder 72, respectively. By putting the material-side flow controller 81 and the carrier-side flow controller 82 into operation, the material gas in the material gas cylinder 71 and the carrier gas in the carrier gas cylinder 72 are introduced into the first film-forming chamber 51 after their flow rates are controlled by the material-side flow controller 81 and the carrier-side flow controller 82, respectively. At this point, the introduction of the material gas and the carrier gas can be suspended by setting the flow rates in the material-side flow controller 81 and the carrier-side flow controller 82 to zero.

Likewise, the material-side flow controller 83 and the carrier-side flow controller 84 are provided between the second film-forming chamber 52 and the material gas cylinder 71 and between the second film-forming chamber 52 and the carrier gas cylinder 72, respectively. The material gas and the carrier gas can be introduced into the second film-forming chamber 52 after their flow rates are controlled by the material-side flow controller 83 and the carrier-side flow controller 84, respectively.

Next, a description will be given of the configuration of each of the first through third film-forming chambers 51 through 53. Since the first through third film-forming chambers 51 through 53 have the same configuration, the following description is given only of the first film-forming chamber 51.

Figure 17:
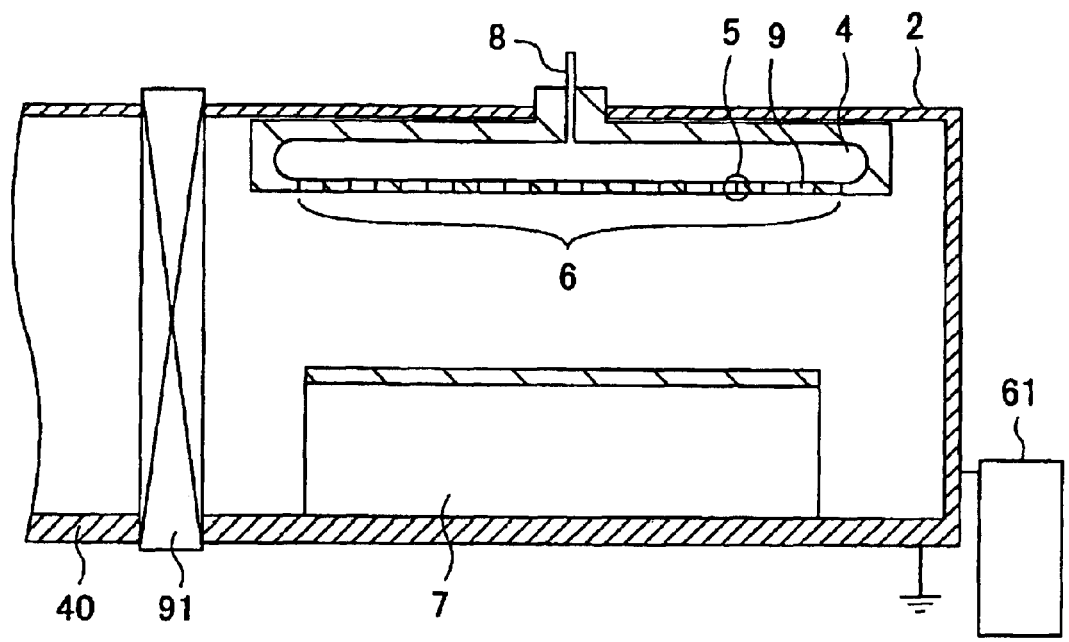
FIG. 17 is a diagram showing part of the CVD apparatus of FIG. 16 according to the seventh embodiment of the present invention.

As shown in FIG. 17, the first film-forming chamber 51 includes a vacuum chamber 2. A placement table 7 is provided inside the vacuum chamber 2 on its bottom face. The placement table 7 is formed to have a flat upper surface so that a later-described substrate can be placed thereon.

Further, a shower plate 6 is provided on the ceiling side inside the vacuum chamber 2.

The shower plate 6 has a gas inlet 8 thereof connected to the gas introduction system 99. A gas mixture emitted from the gas supply source 70 is introduced into a gas retention room 4 through the gas inlet 8.

A multitude of holes 5 are formed on an emission surface 9 of the shower plate 6, so that the gas mixture introduced into the gas retention room 4 through the gas inlet 8 is emitted through the holes 5 to the vacuum chamber 2.

The placement table 7 is provided inside the vacuum chamber 2 on its bottom face so as to be parallel to the emission surface 9 of the shower plate 6. The gas emitted through the holes 5 is blown against the placement table 7.

The heat chamber 55 includes a heater (not shown in the drawings), which heats a substrate up to a predetermined temperature at which a film can be formed thereon.

A description will be given below of a process of forming a metal film on a substrate surface using the above-described vacuum multi-chamber system 1.

After being conveyed from the conveyance chamber 56 into the transportation chamber 40, substrates are transported to the heat chamber 55, where the substrates are heated to the predetermined temperature at which a film can be formed thereon. Thereafter, one of the substrates thus heated is transported to the second film-forming chamber 52 so as to be placed on the placement table 7 thereof. Next, the vacuum valve 92 between the second film-forming chamber 52 and the transportation chamber 40 is closed, and the material gas and the carrier gas are introduced through the gas introduction system 99 into the second film-forming chamber 52.

As a result, the material gas and the carrier gas thus introduced into the second film-forming chamber 52 are blown through the shower plate 6 against the surface of the substrate, so that a metal thin film starts to grow on the surface of the substrate provided inside the second film-forming chamber 52.

After the film formation process in the second film-forming chamber 52 is thus started, the next substrate heated up to the predetermined temperature is introduced from the heat chamber 55 through the transportation chamber 40 to the first film-forming chamber 51 so as to be placed on the placement table 7 thereof. Then, the vacuum valve 91 between the first film-forming chamber 51 and the transportation chamber 40 is closed, and the material gas and the carrier gas are introduced into the first film-forming chamber 51. Thereby, the film formation process in the first film-forming chamber 51 is started.

At this point, the film formation process has been started earlier on the substrate in the second film-forming chamber 52 than on the substrate in the first film-forming chamber 51. Therefore, the substrate processing (film formation process) is completed earlier in the second film-forming chamber 52 than in the first film-forming chamber 51.

According to the multi-chamber system 1 of FIG. 16, when the film formation process on the substrate is completed in the second film-forming chamber 52, the chamber into which the material gas and the carrier gas are introduced is switched, without causing a pressure variation in the first film-forming chamber 51 where the film formation process is in progress, from the second film-forming chamber 52 to a dummy chamber 57 connected to the gas introduction system 99. The gas introduction system 99 includes a material-side flow controller 85 and a carrier-side flow controller 86 that are connected to the dummy chamber 57.

The dummy chamber 57 is a process chamber having the same exhaust conductance as the first and second film-forming chambers 51 and 52. The dummy chamber 57 is formed so as to be evacuated by a vacuum exhaust system 67. As previously described, the dummy chamber 57 is connected to the gas introduction system 99 so that the material gas and the carrier gas are introduced into the dummy chamber 57 after their flow rates are controlled by the material-side flow controller 85 and the carrier-side flow controller 86, respectively.

While the film formation process is performed in the first film-forming chamber 51, the dummy chamber 57 is evacuated by the vacuum exhaust system 67 with no material gas or carrier gas being introduced thereinto. Therefore, at this point, a vacuum is created inside the dummy chamber 57. When the film formation process on the substrate is completed in the second film-forming chamber 52, the material-side flow controller 83 and the carrier-side flow controller 84 are controlled so that the flow rates of the material gas and the carrier gas are set to zero. Further, at the same time that the introduction of the gas mixture of the material gas and the carrier gas to the second film-forming chamber 52 is suspended, the material-side flow controller 85 and the carrier-side flow controller 86 connected to the dummy chamber 57 are operated so that the material gas and the carrier gas are introduced into the dummy chamber 57. At this point, the flow rates of the material gas and the carrier gas introduced into the dummy chamber 57 are controlled so as to be equal to those of the material gas and the carrier gas introduced into the second film-forming chamber 52, respectively.

As a result, after the introduction of the gases into the second film-forming chamber 52 is suspended, the same amount of material gas and carrier gas as introduced into the second film-forming chamber 52 is introduced into the dummy chamber 57.

As previously described, the dummy chamber 57 has the same exhaust conductance as the first and second film-forming chambers 51 and 52. Therefore, the dummy chamber 57 is evacuated at the same exhaust rate as the second film-forming chamber 52. Accordingly, when the same amount of material gas and carrier gas as introduced into the second film-forming chamber 52 is introduced into the dummy chamber 57, the pressure inside the dummy chamber 57 is equalized with the pressure inside the second film-forming chamber 52.

Therefore, even when the introduction of the gases from the gas introduction system 99 into the second film-forming chamber 52 is suspended, the state inside the gas introduction system 99 is just the same as when the gases introduced into the second film-forming chamber 52 are directly introduced into the dummy chamber 57. Thus, switching the chamber into which the gases are introduced from the second film-forming chamber 52 to the dummy chamber 57 causes no pressure variation in any of the material gas cylinder 71 and the carrier gas cylinder 72. Accordingly, no pressure variation is caused inside the first film-forming chamber where the film formation process is in progress by a pressure variation transmitted from any of the cylinders 71 and 72. Thus, the problem that a pressure variation in the first film-forming chamber 51 affects the quality of a metal film that is being formed therein can be avoided effectively.

When the film formation process in the second film-forming chamber 52 is completed, the vacuum valve 92 is opened so that the processed substrate (having a film formed thereon) is transported from the second film-forming chamber 52 to the transportation chamber 40. The substrate thus transported is transported to the next film-forming chamber.

Thereafter, the vacuum valve 95 between the heat chamber 55 and the transportation chamber 40 is opened, so that an unprocessed substrate (processing substrate) heated up to the predetermined film formation temperature in the heat chamber 55 is transported into the transportation chamber 40. Further, the vacuum valve 92 between the second film-forming chamber 52 and the transportation chamber 40 is opened, so that the unprocessed substrate is transported from the transportation chamber 40 into the second film-forming chamber 52.

Thereafter, the vacuum valve 91 is closed, and the material-side flow controller 85 and the carrier-side flow controller 86 connected to the dummy chamber 57 are controlled so that the flow rates of the material gas and the carrier gas are set to zero. Thereby, the introduction of the material gas and the carrier gas into the dummy chamber 57 is suspended. At the same time, the material-side flow controller 83 and the carrier-side flow controller 84 connected to the second film-forming chamber 52 are controlled so that the material gas and the carrier gas are introduced thereinto. At this point, the flow rates of the material gas and the carrier gas introduced into the second film-forming chamber 52 are set to be equal to those of the material gas and the carrier gas introduced into the dummy chamber 57, respectively.

Thus, according to the multi-chamber system 1 of this embodiment, even when the introduction of the gases into the second film-forming chamber 52 is started, the same amount of gases as introduced into the dummy chamber 57 is introduced into the second film-forming chamber 52. Therefore, no variation is caused in the gas flow rates in the first film-forming chamber 51 where the film formation process is in progress, thus causing no pressure variation inside the first film-forming chamber 51.

Thereafter, when the film formation process is completed in the first film-forming chamber 51, like when the film formation process was earlier completed in the second film-forming chamber 52, the introduction of the material gas and the carrier gas into the first film-forming chamber 51 is suspended. At the same time, the same amount of material gas and carrier gas as introduced into the first film-forming chamber 51 is introduced into the dummy chamber 57. As a result, when the film formation process is completed in the first film-forming chamber 51, no variation is caused in the pressure inside the second film-forming chamber 52 where the film formation process is in progress. Thus, according to the multi-chamber system 1 of this embodiment, even when the chamber into which the gases are introduced is switched from one to another, no pressure variation is caused in a processing chamber, and no resultant variation is caused in the quality of a film being formed in the processing chamber.

In the above-described embodiment, both carrier gas and material gas are introduced into the dummy chamber 57. However, the carrier gas of a flow rate equal to the total flow rate of the material gas and the carrier gas introduced into the first or second film-forming chamber 51 or 52, for instance, may be introduced into the dummy chamber 57. In this case, it is possible to prevent the expensive metal material gas from being wasted in the dummy chamber 57, thereby reducing the production costs of semiconductor devices.

Further, in the above-described embodiment, the dummy chamber 57 has the same exhaust conductance as the first and second film-forming chambers 51 and 52. The present invention, however, is not limited to this configuration. Alternatively, for instance, the dummy chamber 57 may have an exhaust conductance half the exhaust conductance of each of the first and second film-forming chambers 51 and 52, and the performance of the vacuum exhaust system 67 connected to the dummy chamber 57 may be twice the performance of that of each of the first and second film-forming chambers 51 and 52. In this case, at the same time that the dummy chamber 57 is evacuated by the vacuum exhaust system 67, the same amount of gas as introduced into the first or second film-forming chamber 51 or 52 where the film formation process is in progress is introduced into the dummy chamber 57. Thereby, the pressure inside the dummy chamber 57 can be equalized with the pressure inside the first or second film-forming chamber 51 or 52, so that a pressure variation can be prevented in the first or second film-forming chamber 51 or 52.

According to the present invention, CVD film formation is performed in first and second CVD film-forming chambers while switching the chamber to which material gas is supplied between the first and second film-forming chambers, thereby improving throughput in substrate processing and semiconductor device manufacturing and preventing the material gas from being wasted. At this point, the switching of the chamber to which the material gas is supplied is performed so that no pressure variation is caused in the material gas supply system. Therefore, the formed CVD film has stable film quality and the formation of an undesirable initial layer can be prevented effectively. Therefore, the present invention is effective particularly in forming by CVD a ferroelectric or high-K dielectric film subject to a pressure variation in the material gas. Further, according to the present invention, by providing a dummy film-forming chamber, the film-forming apparatus can be conditioned as if to be in continuous operation in starting processing successive substrates.

The present invention is not limited to the specifically disclosed embodiments, but variations and modifications may be made without departing from the scope of the present invention.

What is claimed is:

1. A method of manufacturing a semiconductor device, the method comprising the steps of:
   (a) introducing a first processing substrate into a first CVD film-forming chamber;
   (b) raising a temperature of the first processing substrate to a predetermined processing temperature in the first CVD film-forming chamber;
   (c) growing a first film on the first processing substrate in the first CVD film-forming chamber by supplying vapor phase material in a material line to the first CVD film-forming chamber;
   (d) introducing a second processing substrate into a second CVD film-forming chamber;
   (e) raising a temperature of the second processing substrate to the predetermined processing temperature in the second CVD film-forming chamber; and
   (f) growing a second film on the second processing substrate in the second CVD film-forming chamber by supplying the vapor phase material in the material line to the second CVD film-forming chamber, wherein:
   said step (c) includes the step of supplying the vapor phase material in the material line selectively to the first CVD film-forming chamber;
   said step (f) includes the step of supplying the vapor phase material in the material line selectively to the second CVD film-forming chamber; and
   said step (f) is performed after said step (c) by switching, from the first CVD film-forming chamber to the second CVD film-forming chamber, a chamber to which the vapor phase material in the material line is supplied so that a pressure of the vapor phase material in the material line is maintained at a substantially constant value.

2. The method as claimed in claim 1, further comprising the steps of:
   (g) replacing the first processing substrate with a third processing substrate in the first CVD film-forming chamber during said step (f);
   (h) raising a temperature of the third processing substrate to the predetermined processing temperature in the first CVD film-forming chamber; and
   (i) growing a third film on the third processing substrate in the first CVD film-forming chamber by supplying the vapor phase material in the material line selectively to the first CVD film-forming chamber, wherein:
   said steps (h) and (i) are performed after said step (f); and
   said step (i) comprises the step of switching, from the second CVD film-forming chamber to the first CVD film-forming chamber, the chamber to which the vapor phase material in the material line is supplied so that the pressure of the vapor phase material in the material line is maintained at the substantially constant value.

3. The method as claimed in claim 2, wherein the step of switching the chamber to which the vapor phase material is supplied from the second CVD film-forming chamber to the first CVD film-forming chamber comprises the step of gradually increasing an opening of a first valve provided between the material line and the first CVD film-forming chamber, while gradually decreasing an opening of a second valve provided between the material line and the second CVD film-forming chamber in proportion as the opening of the first valve is gradually increased.

4. The method as claimed in claim 2, wherein the step of switching the chamber to which the vapor phase material is supplied from the second CVD film-forming chamber to the first CVD film-forming chamber comprises the step of instantaneously increasing an opening of a first valve provided between the material line and the first CVD film-forming chamber and instantaneously decreasing an opening of a second valve provided between the material line and the second CVD film-forming chamber in accordance with the instantaneous transition of the opening of the first valve.

5. The method as claimed in claim 2, further comprising the steps of:
   (j) replacing the second processing substrate with a fourth processing substrate in the second CVD film-forming chamber during said step (i);
   (k) raising a temperature of the fourth processing substrate to the predetermined processing temperature in the second CVD film-forming chamber; and
   (l) growing a fourth film on the fourth processing substrate in the second CVD film-forming chamber by supplying the vapor phase material in the material line selectively to the second CVD film-forming chamber, wherein:
said steps (k) and (l) are performed after said step (i); and
said step (l) comprises the step of switching, from the first CVD film-forming chamber to the second CVD film-forming chamber, the chamber to which the vapor phase material in the material line is supplied so that the pressure of the vapor phase material in the material line is maintained at the substantially constant value.

6. The method as claimed in claim 5, wherein the step of switching the chamber to which the vapor phase material is supplied from the first CVD film-forming chamber to the second CVD film-forming chamber comprises the step of gradually decreasing an opening of a first valve provided between the material line and the first CVD film-forming chamber, while gradually increasing an opening of a second valve provided between the material line and the second CVD film-forming chamber in proportion as the opening of the first valve is gradually decreased.

7. The method as claimed in claim 5, wherein the step of switching the chamber to which the vapor phase material is supplied from the first CVD film-forming chamber to the second CVD film-forming chamber comprises the step of instantaneously decreasing an opening of a first valve provided between the material line and the first CVD film-forming chamber and instantaneously increasing an opening of a second valve provided between the material line and the second CVD film-forming chamber in accordance with the instantaneous transition of the opening of the first valve.

8. The method as claimed in claim 1, wherein the first and second CVD film-forming chambers are further supplied with oxygen gas.

9. The method as claimed in claim 1, further comprising the step of supplying the vapor phase material in the material line selectively to a dummy film-forming chamber before said step (c),
wherein said step (c) comprises the step of switching, from the dummy film-forming chamber to the first CVD film-forming chamber, the chamber to which the vapor phase material in the material line is supplied so that the pressure of the vapor phase material in the material line is maintained at the substantially constant value.

10. The method as claimed in claim 1, wherein the vapor phase material comprises an organometallic compound.

11. The method as claimed in claim 1, wherein the switching of the chamber to which the vapor phase material is supplied from the first CVD film-forming chamber to the second CVD film-forming chamber comprises the step of gradually decreasing an opening of a first valve provided between the material line and the first CVD film-forming chamber, while gradually increasing an opening of a second valve provided between the material line and the second CVD film-forming chamber in proportion as the opening of the first valve is gradually decreased.

12. The method as claimed in claim 1, wherein the switching of the chamber to which the vapor phase material is supplied from the first CVD film-forming chamber to the second CVD film-forming chamber comprises the step of instantaneously decreasing an opening of a first valve provided between the material line and the first CVD film-forming chamber and instantaneously increasing an opening of a second valve provided between the material line and the second CVD film-forming chamber in accordance with the instantaneous transition of the opening of the first valve.

13. The method as claimed in claim 1, wherein:
the step of supplying the vapor phase material in the material line selectively to the first CVD film-forming chamber in said step (c) further comprises the step of simultaneously supplying inert gas to the second CVD film-forming chamber; and
the step of supplying the vapor phase material in the material line selectively to the second CVD film-forming chamber in said step (f) further comprises the step of simultaneously supplying inert gas to the first CVD film-forming chamber.

14. A film-forming method using a gas supply source and first and second film-forming chambers connected thereto, the film-forming method placing first and second substrates inside the first and second film-forming chambers, respectively, and forming a thin film on a surface of each of the first and second substrates by introducing material gas for the thin films from the gas supply source into the first and second film-forming chambers while evacuating the first and second film-forming chambers, wherein:
a dummy film-forming chamber different from the first and second film-forming chambers is provided so as to be connected to the gas supply source; and
at a time of completing the formation of the thin film on the first substrate in the first film-forming chamber while continuing the formation of the thin film on the second substrate in the second film-forming chamber, the dummy film-forming chamber is pre-evacuated so that the material gas equal in amount to the material gas introduced into the first film-forming chamber is introduced from the gas supply source into the pre-evacuated dummy film-forming chamber while the introduction of the material gas into the first-film forming chamber is suspended.

15. The film-forming method as claimed in claim 14, wherein an exhaust conductance of the dummy film-forming chamber is equalized with that of each of the first and second film-forming chambers.

16. The film-forming method as claimed in claim 14, wherein:
after the formation of the thin film on the substrate is completed in the first film-forming chamber while the formation of the thin film on the substrate is continued in the second film-forming chamber, an unprocessed substrate is transported into the first film-forming chamber so that formation of a thin film on the unprocessed substrate is started in the first CVD film-forming chamber; and
the introduction of the material gas into the dummy film-forming chamber is suspended while the material gas equal in amount to the material gas introduced into the dummy film-forming chamber is introduced into the first film-forming chamber when the formation of the thin film on the substrate is started in the first film-forming chamber.

17. The film-forming method as claimed in claim 16, wherein:
carrier gas excluding component material for the thin films is introduced, together with the material gas, into the first and second film-forming chambers in forming the thin films on the first and second substrates; and
the carrier gas equal in amount to the carrier gas introduced into the first film-forming chamber is introduced, together with the material gas, into the dummy film-forming chamber when the formation of the thin film on the substrate is completed in the first film-forming chamber.

18. The film-forming method as claimed in claim 16, wherein:

carrier gas excluding component material for the thin films is introduced, together with the material gas, into the first and second film-forming chambers in forming the thin films on the first and second substrates; and the carrier gas equal in amount to the carrier gas introduced into the dummy film-forming chamber is introduced, together with the material gas, into the first film-forming chamber when the formation of the thin film on the substrate is started in the first film-forming chamber.

19. The film-forming method as claimed in claim 14, wherein:

carrier gas excluding component material for the thin films is introduced, together with the material gas, into the first and second film-forming chambers in forming the thin films on the first and second substrates; and the carrier gas equal in amount to the carrier gas introduced into the first film-forming chamber is introduced, together with the material gas, into the dummy film-forming chamber when the formation of the thin film on the substrate is completed in the first film-forming chamber.

20. The film-forming method as claimed in claim 14, wherein:

carrier gas excluding component material for the thin films is introduced, together with the material gas, into the first and second film-forming chambers in forming the thin films on the first and second substrates; and the carrier gas equal in amount to the carrier gas introduced into the dummy film-forming chamber is introduced, together with the material gas, into the first film-forming chamber when the formation of the thin film on the substrate is started in the first film-forming chamber.

21. A film-forming apparatus comprising:

a first CVD film-forming chamber capable of, after a first processing substrate is introduced thereinto, raising a temperature of the first processing substrate to a predetermined processing temperature and forming a first film on the first processing substrate while supplying vapor phase material in a material line to the first CVD film-forming chamber; and a second CVD film-forming chamber capable of, after a second processing substrate is introduced thereinto, raising a temperature of the second processing substrate to the predetermined processing temperature and forming a second film on the second processing substrate while supplying the vapor phase material in the material line to the second CVD film-forming chamber, wherein:

the vapor phase material in the material line is supplied selectively to the first film-forming chamber in growing the first film on the first processing substrate in the first film-forming chamber;

a chamber to which the vapor phase material in the material line is supplied is switched from the first film-forming chamber to the second film-forming chamber after the first film is formed on the first processing substrate in the first film-forming chamber in growing the second film on the second processing substrate in the second film-forming chamber; and the switching of the chamber to which the vapor phase material is supplied is performed so that a pressure of the vapor phase material in the material line is maintained at a substantially constant value.

22. The film-forming apparatus as claimed in claim 21, wherein:

the first processing substrate is replaceable with a third processing substrate while growing the second film on the second processing substrate in the second film-forming chamber;

a third film is formable on the third processing substrate while raising a temperature of the third processing substrate to the predetermined processing temperature in the first film-forming chamber and supplying the vapor phase material in the material line selectively to the first film-forming chamber after the second film is grown on the second processing substrate in the second film-forming chamber; and the chamber to which the vapor phase material in the material line is supplied is switched from the second film-forming chamber to the first film-forming chamber so as to grow the third film on the third processing substrate in the first film-forming chamber, so that the pressure of the vapor phase material in the material line is maintained at the substantially constant value.

23. The film-forming apparatus as claimed in claim 22, wherein:

the second processing substrate is replaceable with a fourth processing substrate while growing the third film on the third processing substrate in the first film-forming chamber;

a fourth film is formable on the fourth processing substrate while raising a temperature of the fourth processing substrate to the predetermined processing temperature in the second film-forming chamber and supplying the vapor phase material in the material line selectively to the second film-forming chamber after the third film is grown on the third processing substrate in the first film-forming chamber; and the chamber to which the vapor phase material in the material line is supplied is switched from the first film-forming chamber to the second film-forming chamber so as to grow the fourth film on the fourth processing substrate in the second film-forming chamber, so that the pressure of the vapor phase material in the material line is maintained at the substantially constant value.

24. The film-forming apparatus as claimed in claim 21, wherein the first and second film-forming chamber can be further supplied with oxygen gas.

25. The film-forming apparatus as claimed in claim 21, further comprising a dummy film-forming chamber different from the first and second film-forming chambers, wherein:

the vapor phase material in the material line can be supplied selectively to the dummy film-forming chamber before growing the first film on the first processing substrate in the first film-forming chamber; and the chamber to which the vapor phase material in the material line is supplied is switched from the dummy film-forming chamber to the first film-forming chamber, in growing the first film on the first processing substrate in the first film-forming chamber, so that the pressure of the vapor phase material in the material line is maintained at the substantially constant value.

26. The film-forming apparatus as claimed in claim 21, wherein the vapor phase material comprises an organometallic compound.

27. The method as claimed in claim 1, further comprising the steps of:

(g) replacing the first processing substrate with a third processing substrate in the first CVD film-forming chamber and raising a temperature of the third processing substrate to the predetermined processing temperature in the first CVD film-forming chamber during said step (f); and (h) growing a third film on the third processing substrate in the first CVD film-forming chamber by supplying the vapor phase material in the material line selectively to the first CVD film-forming chamber after said step (f), wherein said step (h) includes the step of switching, from the second CVD film-forming chamber to the first CVD film-forming chamber, the chamber to which the vapor phase material in the material line is supplied, the step of switching being performed so that the pressure of the vapor phase material in the material line is maintained at the substantially constant value.

28. The method as claimed in claim 27, further comprising the steps of:

(i) replacing the second processing substrate with a fourth processing substrate in the second CVD-film forming chamber and raising a temperature of the fourth processing substrate to the predetermined processing temperature in the second CVD-film forming chamber during said step (h); and (j) growing a fourth film on the fourth processing substrate in the second CVD film-forming chamber by supplying the vapor phase material in the material line selectively to the second CVD film-forming chamber after said step (h), wherein said step (j) includes the step of switching, from the first CVD film-forming chamber to the second CVD film-forming chamber, the chamber to which the vapor phase material in the material line is supplied, the step of switching being performed so that the pressure of the vapor phase material in the material line is maintained at the substantially constant value.

* * * * *